(12) United States Patent
Cain et al.

(10) Patent No.: US 8,986,793 B2
(45) Date of Patent: Mar. 24, 2015

(54) PRODUCTION OF ELECTRONIC DEVICES

(75) Inventors: Paul Cain, Cambridge (GB); Anoop Menon, Cambridge (GB); Henning Sirringhaus, Cambridge (GB); James D. Watts, Ely (GB); Tim Von Werne, London (GB); Thomas M. Brown, Rome (IT)

(73) Assignee: Plastic Logic Limited, Cambridge (GB)

( * ) Notice: Subject to any disclaimer, the term of this patent is extended or adjusted under 35 U.S.C. 154(b) by 1468 days.

(21) Appl. No.: 10/570,264

(22) PCT Filed: Sep. 2, 2004

(86) PCT No.: PCT/GB2004/003754
§ 371 (c)(1),
(2), (4) Date: Jul. 28, 2006

(87) PCT Pub. No.: WO2005/022664
PCT Pub. Date: Mar. 10, 2005

(65) Prior Publication Data
US 2007/0012950 A1 Jan. 18, 2007

(30) Foreign Application Priority Data
Sep. 2, 2003 (GB) .................................. 0320491.4
Dec. 23, 2003 (GB) .................................. 0329740.5

(51) Int. Cl.
*B05D 3/00* (2006.01)
*B82Y 10/00* (2011.01)
*B82Y 30/00* (2011.01)
*H01L 51/00* (2006.01)
*H01L 51/05* (2006.01)

(52) U.S. Cl.
CPC ................. *B82Y 10/00* (2013.01); *B82Y 30/00* (2013.01); *H01L 51/0004* (2013.01); *H01L 51/0012* (2013.01); *H01L 51/0021* (2013.01); *H01L 51/0516* (2013.01); *H01L 51/0541* (2013.01); *H01L 51/0545* (2013.01)
USPC ........................................................ 427/553

(56) References Cited

(58) Field of Classification Search
None
See application file for complete search history.

(56) References Cited

U.S. PATENT DOCUMENTS

| 4,340,617 A | * | 7/1982 | Deutsch et al. ............... 427/581 |
| 4,578,157 A | * | 3/1986 | Halliwell et al. ................ 205/86 |
| 6,379,745 B1 | | 4/2002 | Kydd et al. |
| 2001/0050414 A1 | * | 12/2001 | Mih et al. ....................... 257/622 |
| 2002/0067123 A1 | * | 6/2002 | Seki et al. ...................... 313/504 |
| 2002/0090565 A1 | * | 7/2002 | Griffith et al. ................ 430/198 |
| 2003/0059975 A1 | | 3/2003 | Sirringhaus et al. |
| 2003/0059984 A1 | * | 3/2003 | Sirringhaus et al. .......... 438/141 |
| 2003/0059987 A1 | | 3/2003 | Sirringhaus et al. |
| 2003/0060038 A1 | | 3/2003 | Sirringhaus et al. |
| 2003/0124259 A1 | * | 7/2003 | Kodas et al. ............... 427/376.6 |
| 2005/0026317 A1 | | 2/2005 | Sirringhaus et al. |

FOREIGN PATENT DOCUMENTS

| WO | 98/37133 A1 | 8/1998 |
| WO | WO 98/37133 A | 8/1998 |
| WO | 01/47045 A1 | 6/2001 |
| WO | WO 01/47045 A | 6/2001 |
| WO | WO 02/095805 A | 11/2002 |
| WO | WO02095805 | * 11/2002 |

OTHER PUBLICATIONS

Arctic Silver Incorporated product sheet for premium silver polysynthetic thermal compound. http://www.arcticsilver.com/as3.htm, retrieved by the internet archive on Aug. 6, 2003.*
Callister, William Jr. Materials Science and Engineering: an Introduction. 4th Edition. (1997). p. 600.*
Assael et al. International Journal of Thermophysics, vol. 26, No. 5 Sep. 2005, pp. 1595-1605.*
Thomasson et al. IEEE Electron Device Letters, vol. 19, No. 4, (1998), pp. 124-126.*

Abdel-Ati (Journal of Thermal Analysis, vol. 42 (1994) 1113-1122).*

* cited by examiner

*Primary Examiner* — Michael Cleveland
*Assistant Examiner* — Joel Horning
(74) *Attorney, Agent, or Firm* — Sughrue Mion, PLLC

(57) ABSTRACT

A method of producing a metal element of an electronic device on a substrate, including the steps of: forming a mixture of a material comprising metal atoms with a liquid, depositing the material from the liquid mixture onto a substrate, and then irradiating at least part of the deposited material with light to increase the electrical conductivity of the deposited material. A method of producing one or more elements of an electronic device, including the steps of: providing a substrate including one or more underlying elements of the electronic device and a thermally patternable layer overlying said one or more underlying elements; and using said one or more underlying elements to locally generate heat and thereby selectively induce a change in corresponding portions of said thermally patternable layer; and wherein either the change selectively induced in said corresponding portions directly results in the definition of one or more elements of the electronic device in a position determined by that of said one or more underlying elements, or alternatively including the additional step of using the change selectively induced in said one or more corresponding portions to facilitate the formation of one or more elements of the electronic device in a position determined by that of said one or more underlying elements. A method of producing an element of an electronic device, including the steps of: (a) providing a substrate; (b) depositing on said substrate a layer of a switchable material, which changes its physical or chemical properties upon irradiation with light or heating causing a change of its surface energy properties; (c) irradiatively inducing at selected regions of a layer of switchable material a change in physical or chemical properties that alters the surface energy of said selected regions and thereby forming a surface energy pattern on its surface; and (d) without removing said layer of switchable material in either irradiated selected regions or non-irradiated regions from the substrate depositing over the surface energy pattern produced in step (c) a material for forming an element of the electronic device such that the surface energy pattern controls the deposition of said material.

1 Claim, 20 Drawing Sheets

Figure 4
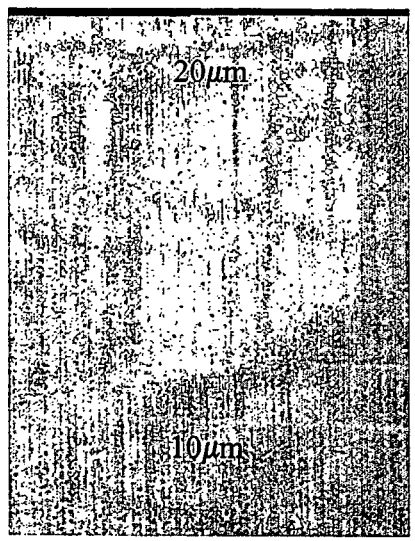 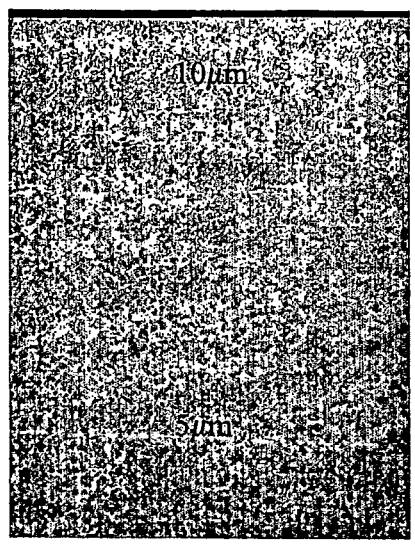

Figure 7
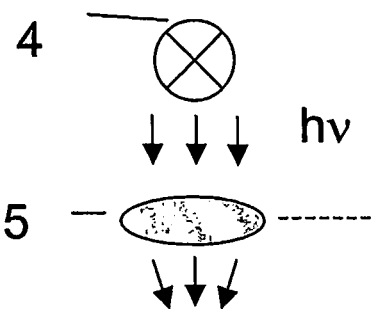
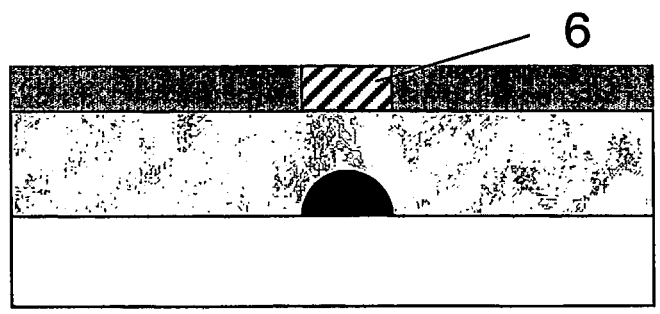
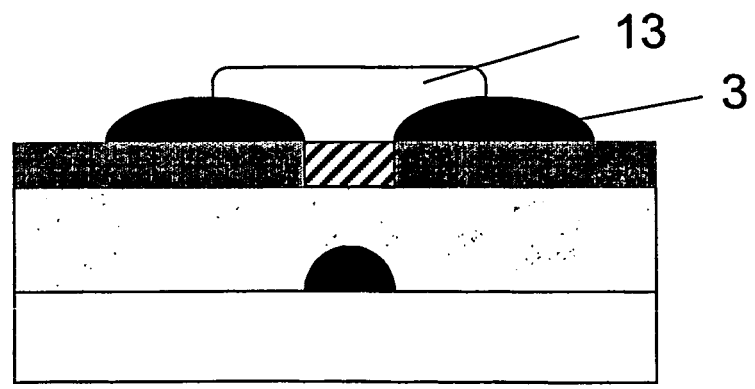

Figure 8
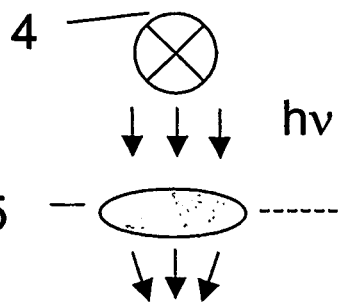
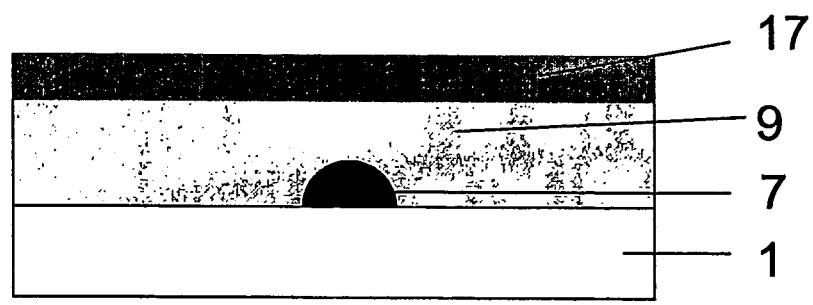
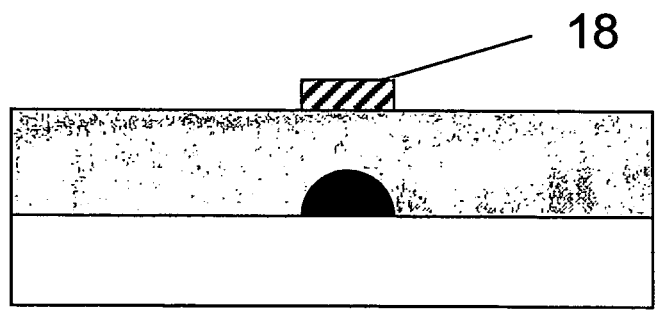
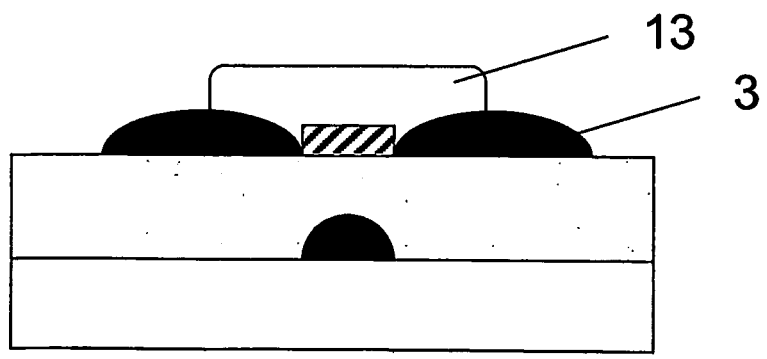

Figure 17
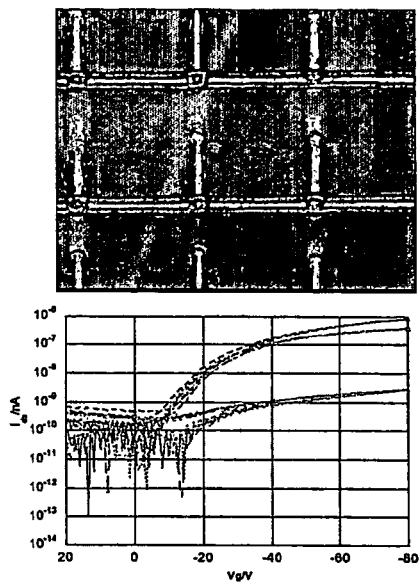
2W 1m/s
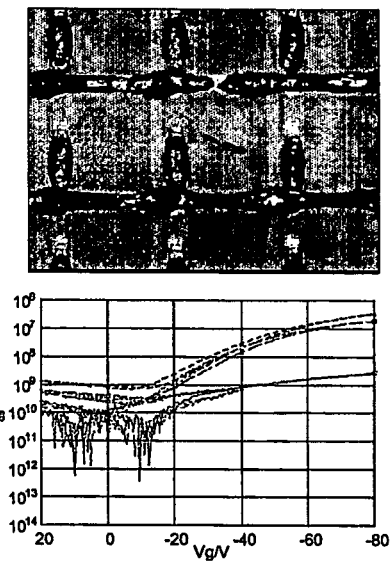
3W 1m/s
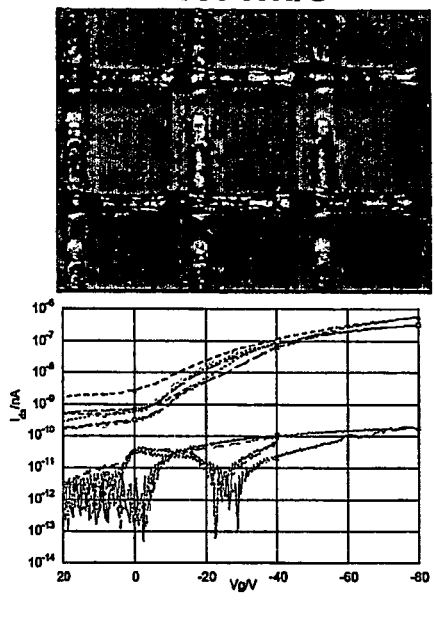
4W 1m/s
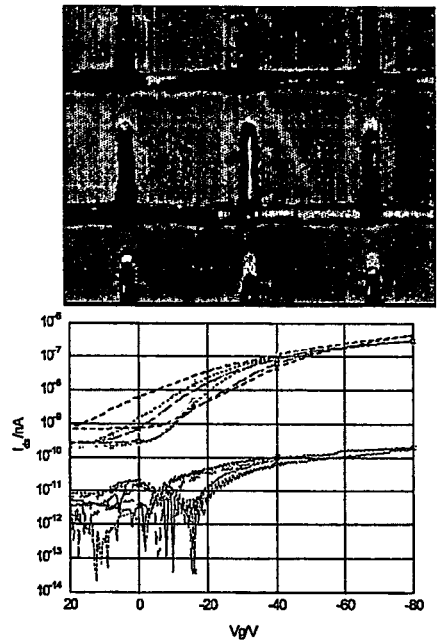
5W 1m/s
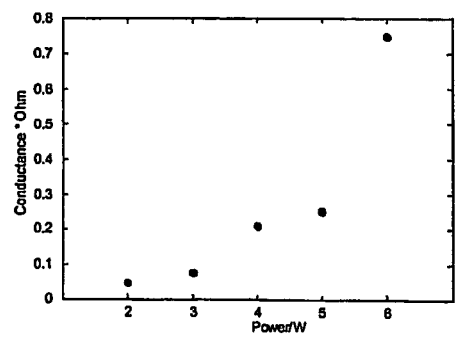

PRODUCTION OF ELECTRONIC DEVICES

This invention relates to the fabrication of electronic devices, such as for example polymer transistors, and in particular to the patterning and confinement of elements of thin film transistors (TFTs) in multi-level structures using solution processing and direct printing techniques.

In accordance with the prior art, conventional manufacturing processes for TFTs are based primarily on high-resolution photolithographic patterning, and vacuum processing. The use of ultraviolet photolithography to achieve patterning with micron scale critical features and line widths is a known process. Manufacturing processes based on solution processing and direct printing are of interest for applications requiring large-area circuits on flexible substrates or low-cost electronics.

In US 2003/0059984 a general method for definition of high resolution patterns by printing is described that is based on the definition of a surface energy pattern, prior to the printing step. The surface energy pattern controls the flow and spreading of liquid droplets deposited onto the substrate and enables accurate patterning of critical features. These surface energy patterns can be generated by several different techniques including photolithography and soft lithographic stamping.

In WO02/095805 a general method is described for generation of surface energy patterns by exposure of the substrate to focussed light beams. It is reported that an array of laser beams may be used, each of which can be switched on and off individually. This allows direct-write definition of arbitrary surface patterns without the use of photomasks, i.e. the technique is fully compatible with direct-write materials deposition by direct printing. The general technique is applicable to patterning on any level of the device, for example both on the source-drain level as well as on the gate-level level or other interconnect/electrode levels of the device. Various photosensitive surface layers are disclosed that allow generation of surface energy patterns by light exposure.

Many direct printing techniques developed for graphic arts printing applications are unable to provide the micrometer resolution required to produce TFTs or other electronic components with a useful level of performance.

Manufacturing of TFTs requires several high-resolution patterning steps. One of the critical dimensions of a TFT is the channel length, which should be on the order of several micrometers or less.

Another critical dimension is the gate electrode line width which should be at least equal to the channel length. The gate line width is one of the key factors that determine the switching speed of the TFT, because it relates directly to the parasitic source-drain to gate overlap capacitance of the TFT. In general, the electrode and interconnect line widths determine the parasitic capacitance in the circuits and should be as narrow as is compatible with achieving the required conductance.

The position of the gate electrode should ideally be self-aligned with respect to the source and drain electrodes, i.e. the linewidth of the gate electrode should be defined in such a way that it equals approximately the separation of the source and drain electrodes and the patterning process of either source-drain and/or gate electrodes should be such that the edges of the gate electrode are aligned automatically with the channel facing edge of the source and drain electrode, respectively.

In the prior art self-aligned gate TFT structures have been demonstrated for inorganic TFTs fabricated by photolithography. In a self-aligned, photolithographic a-Si TFT process (D. B. Thomasson et al., IEEE Electron Device Letters 19, 124 (1998)) the gate electrode is used as an opaque shadow mask during photolithographic patterning of the source and drain electrodes. The photoresist layer for the definition of the source and drain electrode is exposed to UV light from the back of the substrate, such that the gate electrode shadows the photoresist in the channel region of the TFT from the UV exposure. This allows self-aligned patterning of source-drain electrodes after subsequent developing of the resist and etching or lift-off patterning of the source-drain metal layer. Self-aligned patterning approaches based on direct-write printing techniques have not been disclosed.

The formation of pixel electrodes in displays requires both accurate patterning and small gaps with neighbouring pixels and interconnect lines, in order to achieve a high aperture ratio of the display. The aperture ratio may be defined as the switchable area of the pixel divided by the total area dedicated to one pixel electrode.

The semiconducting active layer should be patterned into an active layer island to suppress parasitic leakage current between neighbouring TFTs.

Another key requirement for high performance TFTs is the ability to form high conductivity electrodes and/or interconnects both on the source-drain level, and on the gate level. In many cases the conductivity of conducting polymers is not sufficient, and printable inorganic metals are preferred. However, these often require thermal conversion steps in order to convert the printed metal deposit from a low-conductivity, as-deposited form into a highly conductive material. The step of thermal conversion, which for many printable inorganic metals based on either chemical precursor routes or surface-functionalized nanoparticles requires temperatures on the order of 150-300° C. (M. Furusawa et al., Society for Information Display SID 02 Digest, page 753 (2002)), is problematic in particular when the printable metal is deposited as an upper layer on top of a multilayer structure that may already contain surface functionalization, metallic, semiconducting, and dielectric active layers of the device. In this case the thermal conversion step can cause delamination of the underlying layer structure, or materials degradation of one or more materials in the multilayer structure.

It is an aim of the present invention to provide new techniques for producing elements of electronic devices.

According to one aspect of the present invention, there is provided a method of producing a metal element of an electronic device on a substrate, including the steps of: forming a mixture of a material comprising metal atoms with a liquid, depositing the material from the liquid mixture onto a substrate, and then irradiating at least part of the deposited material with light to increase the electrical conductivity of the deposited material.

According to another aspect of the present invention, there is provided a method of producing one or more elements of an electronic device, including the steps of: providing a substrate including one or more underlying elements of the electronic device and a thermally patternable layer overlying said one or more underlying elements; and using said one or more underlying elements to locally generate heat and thereby selectively induce a change in corresponding portions of said thermally patternable layer; and wherein either the change selectively induced in said corresponding portions directly results in the definition of one or more elements of the electronic device in a position determined by that of said one or more underlying elements, or alternatively including the additional step of using the change selectively induced in said one or more corresponding portions to facilitate the formation of one or more elements of the electronic device in a position determined by that of said one or more underlying elements.

According to another aspect of the present invention, there is provided a method of producing an element of an electronic device, including the steps of: (a) providing a substrate; (b) depositing on said substrate a layer of a switchable material, which changes its physical or chemical properties upon irradiation with light or heating causing a change of its surface energy properties; (c) irradiatively inducing at selected regions of a layer of switchable material a change in physical or chemical properties that alters the surface energy of said selected regions and thereby forming a surface energy pattern on its surface; and (d) without removing said layer of switchable material in either irradiated selected regions or non-irradiated regions from the substrate depositing over the surface energy pattern produced in step (c) a material for forming an element of the electronic device such that the surface energy pattern controls the deposition of said material.

According to another aspect of the present invention, there is provided a method of producing an element of an electronic device, including the steps of: (a) providing a substrate; (b) irradiatively inducing at selected regions of a surface of the substrate a chemical change that alters the surface energy of said selected regions and thereby form a surface energy pattern at said surface; and (c) depositing over the surface energy pattern produced in step (b) a material for forming an element of the electronic device such that the surface energy pattern controls the deposition of said material.

Embodiments of the present invention provide specific methods by which high performance conductive or semiconductive patterns with small line widths, in particular high conductivity interconnects and electrodes may be defined by a combination of laser patterning and direct-write deposition. The techniques are particularly suitable for patterning on upper levels of multi-level devices, as well as for self-aligned patterning by printing. Such devices incorporate electroactive layers or complete TFTs or other active devices that are positioned between the substrate and the conductive or semiconductive patterning layer.

Embodiments of the present invention provide improved methods for the fabrication of polymer transistors, in particular the patterning and confinement of active components of thin film transistors (TFTs) that are particularly suitable for use in multi-level structures using solution processing and direct printing techniques.

A first embodiment is a surface energy assisted printing process, based on a light-sensitive materials system that switches its surface energy upon exposure to light. The 'switchable' materials system may be a 'thermally switchable' one whereby light from the laser beam is absorbed by a material and converted into heat, which induces a chemical reaction, or a 'photoswitchable' one which involves a photochemical reaction. Both 'thermally switchable' and 'photoswitchable' reactions result in a change in the water attractive properties. The materials system does not require additional treatment after light exposure, such as a development step to exhibit the desired surface energy contrast.

A second embodiment of the present invention uses a sacrificial light absorbing layer with a high optical density to define a pattern in a multilayer structure of functional electronic materials. The absorbing layer is a polymer layer comprising a dye which absorbs the incident light radiation. The absorption causes local heating of the underlying layer in contact with the light absorbing layer and by heating modifies the physico-chemical properties of the underlying layer. In a subsequent step the absorbing layer is washed off the substrate, and the pattern generated by heating in the underlying layer can be developed. Alternatively, the absorbing layer is an ultra-thin layer of laser light absorbing dye molecules with high optical density onto the surface layer of the device. The dye molecules are locally desorbed from the substrate upon light exposure to uncover the surface of the underlying substrate, and in this way to define a surface energy pattern, which is then used subsequently for the accurate definition of a electroactive layer of the device.

A third embodiment of the present invention is a process for forming a self-aligned electrode, which is based on defining a pattern of first conductive, semiconductive, or surface energy modification layer on the substrate, depositing a series of other materials on top, and patterning a second conductive, semiconductive, or surface energy modification layer by exposing the substrate to a light beam of a wavelength that is strongly absorbed in the material of the first conductive, semiconductive, or surface energy modification pattern, resulting in local heating of the layer structure on top, such that a local change in the physical or chemical properties of the second conductive, semiconductive or surface energy modification layer is induced, that results in self-aligned patterning of the second conductive, semiconductive or surface energy modification layer. The light beam is preferably an infrared light beam. The process is particularly useful for forming bottom gate TFT structures.

A fourth embodiment of the present invention is a process for forming a self-aligned electrode, which is based on defining a pattern of a first conductive, semiconductive, or surface energy modification layer on the substrate, depositing a series of other materials on top, and patterning a second conductive, semiconductive, or surface energy modification layer by scanning a focussed light beam across the substrate, impinging on the substrate from the backside with a wavelength at which the first conductive, semiconductive or surface energy modification layer is opaque, such that a local change in the physical or chemical properties of the second conductive, semiconductive or surface energy modification layer is induced in all locations where the light beam was scanned, except in those regions where the path of the light was blocked by the first conductive, semiconductive or surface energy modification pattern.

A fifth embodiment of the present invention is a technique that enables laser annealing of a layer of a printed conductive or semiconductive material deposited on top of a substrate containing other electroactive layers and conversion of the printed conductive or semiconductive material into a high conductive state by laser annealing without significant degradation of such previously deposited electroactive layers. The printed conductive or semiconductive material is preferably an inorganic metallic nanoparticle or a chemical precursor molecule to an inorganic metal. The technique involves printing a first line of conductive or semiconductive material on a substrate followed by local annealing with a focussed laser beam with a lateral beam width that is less than the linewidth of the printed line, resulting in local conversion of a portion of the printed line into a high conductivity form. During the step of local annealing of the first line of conductive or semiconductive material a second conductive, semiconductive, or surface energy modification layer is patterned by the focussed laser beam, in such a way that the pattern of the second conductive, semiconductive or surface energy modification layer is self-aligned with the high conductivity portion of the first line of conductive or semiconductive material.

By way of example only, embodiments of the present invention are hereunder described in more detail with reference to the accompanying drawings, in which:

FIG. 4 shows optical micrographs of a substrate with a hydrophobic film of which has been selectively switched to hydrophilic in the areas of the film which have been patterned with a laser.

Figure 6:
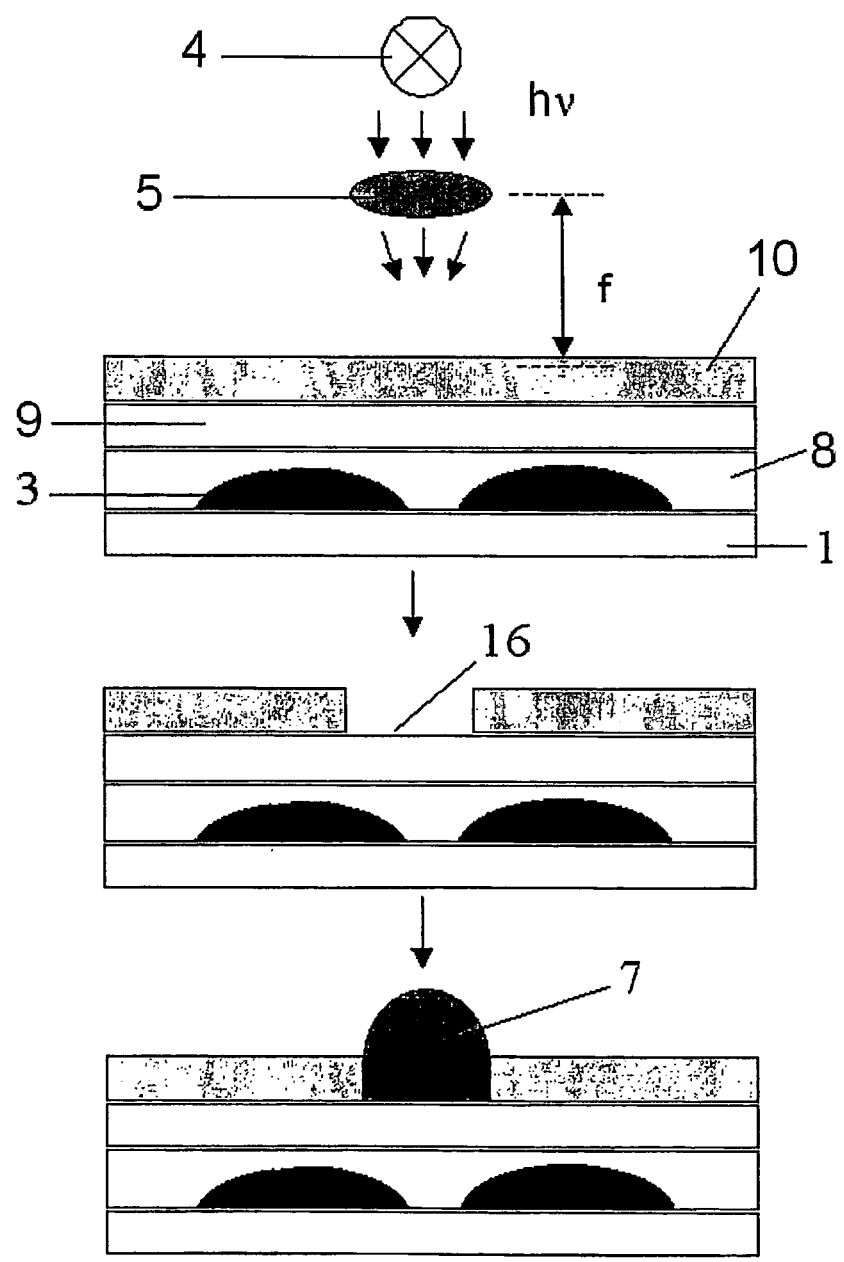

FIG. 6 shows a process of direct laser writing of a surface energy pattern by thermally induced selective removal of a layer of dye molecules, followed by liquid deposition of an active component of the device according to the present invention FIG. 7 shows a process for a self-aligned, bottom-gate TFT based on laser patterning of a thermally switchable surface energy modification layer, wherein the laser light is absorbed only in the region of the gate electrode causing local heating of the surface modification layer on top.

FIG. 8 shows a process for a self-aligned, bottom-gate TFT based on laser patterning of a thermally crosslinkable surface energy modification layer, wherein the laser light is absorbed only in the region of the gate electrode causing local heating of the surface modification layer on top.

Figure 9:
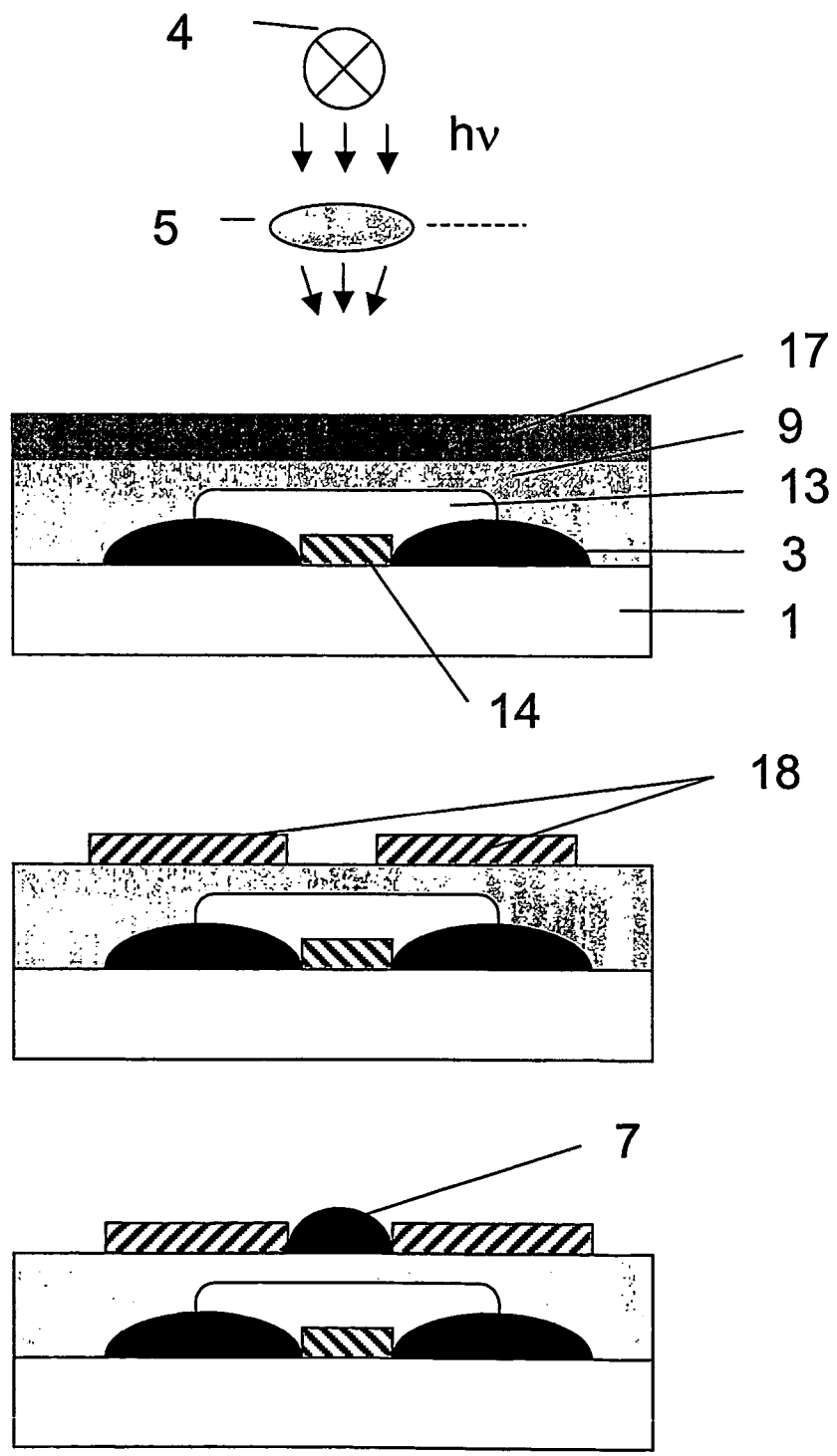

FIG. 9 shows a process for a self-aligned, top-gate TFT based on laser patterning of a surface energy modification layer, wherein the laser light is absorbed only in the region of the source-drain electrode causing local heating of the surface modification layer on top.

Figure 10:
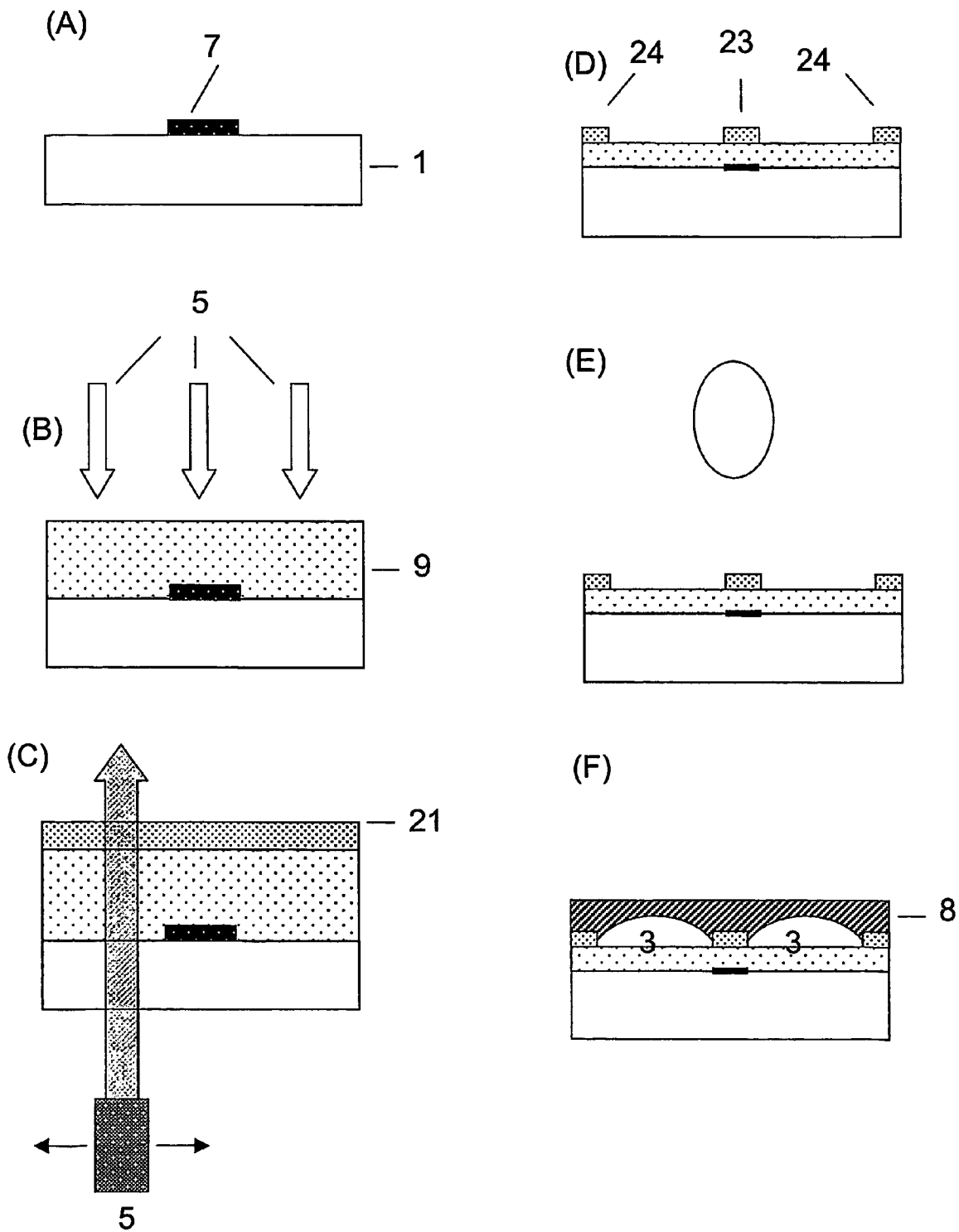

FIG. 10 shows a process for forming a self-aligned bottom gate transistor involving a developing process of washing away the photo-patterned structures after deposition of the source and drain electrodes.

Figure 11:
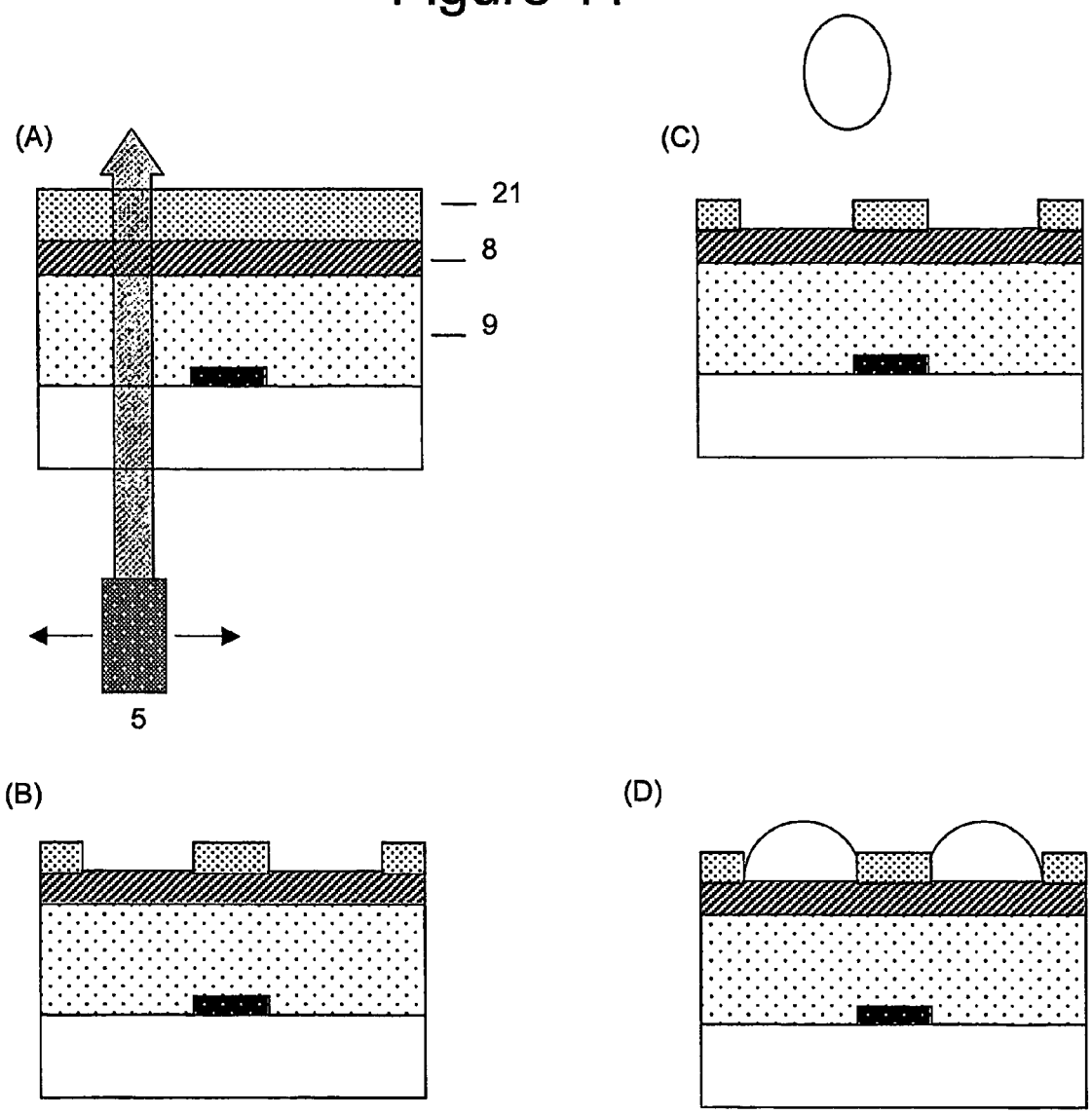

FIG. 11 shows a self-aligned bottom gate transistor incorporating a semiconductor layer under a photopatternable layer.

Figure 12:
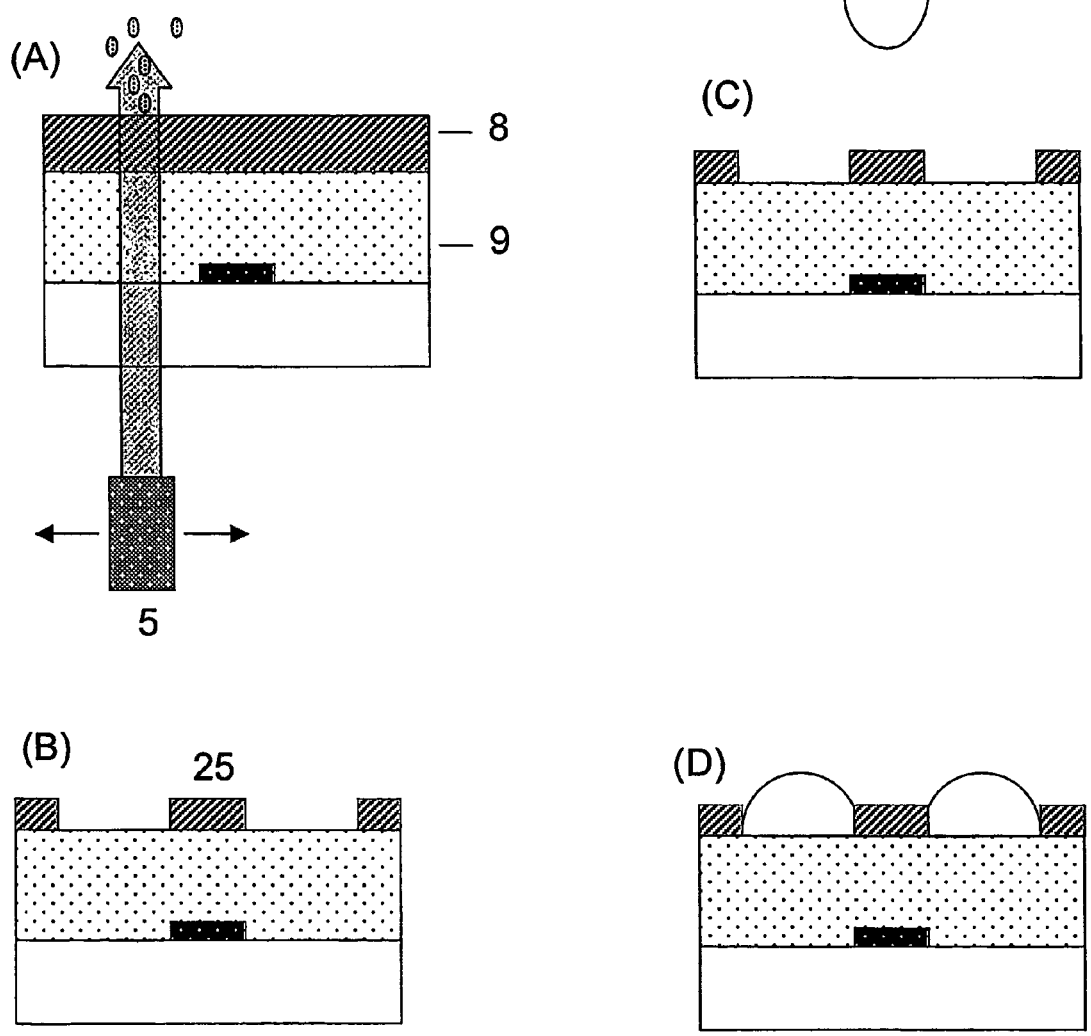

FIG. 12 illustrates a method for forming a self-aligned bottom gate transistor, involving a semiconducting layer being deposited over a dielectric layer. The laser beam is used to ablate away the semiconductor, leaving a strip of semiconductor that is self-aligned over the gate electrode.

Figure 13:
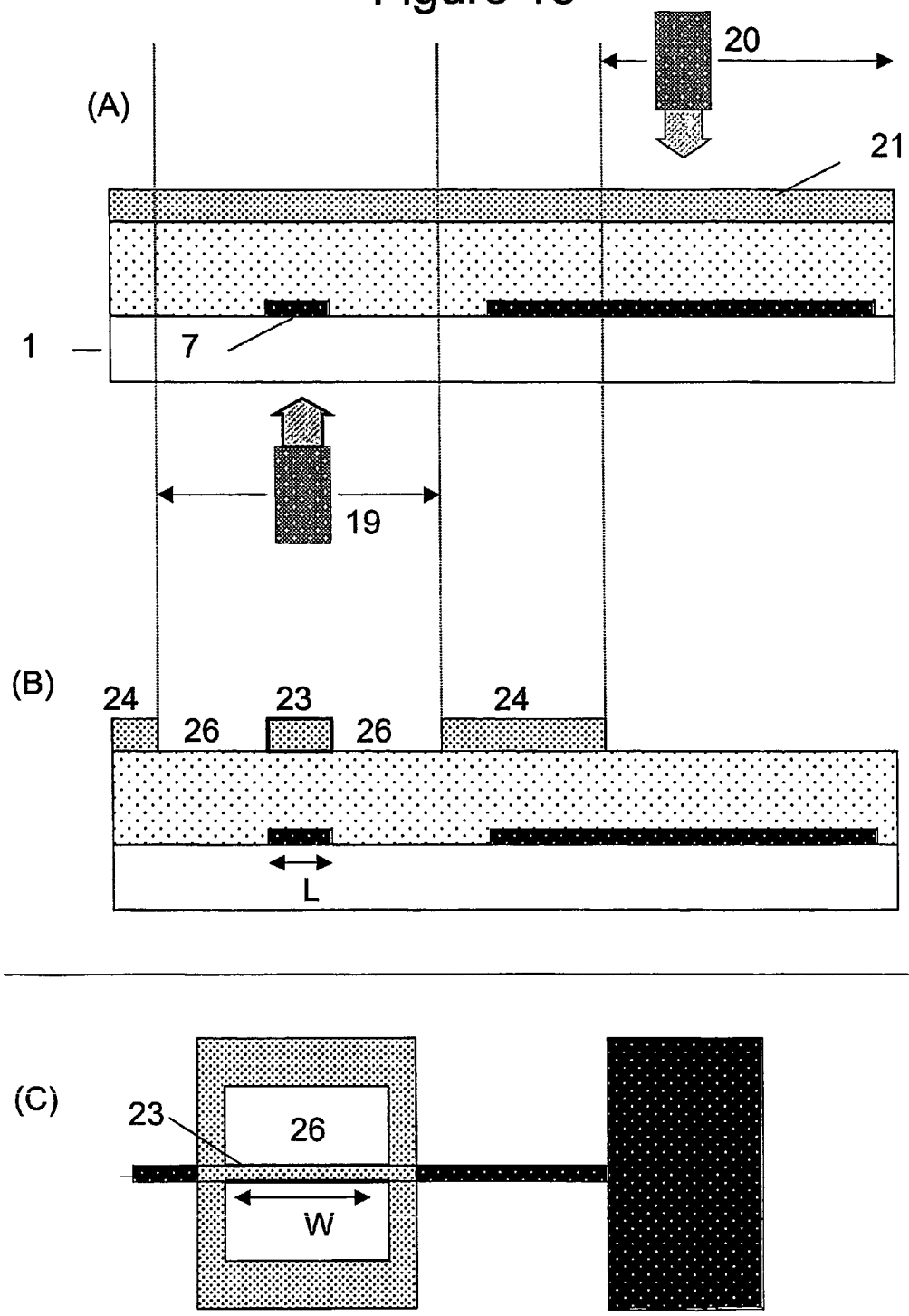

FIG. 13 shows a cross-section of a self-aligned bottom gate transistor device, both before (A) and after (B) the photo-patternable layer has been patterned via the combination of two laser heads.

Figure 14:
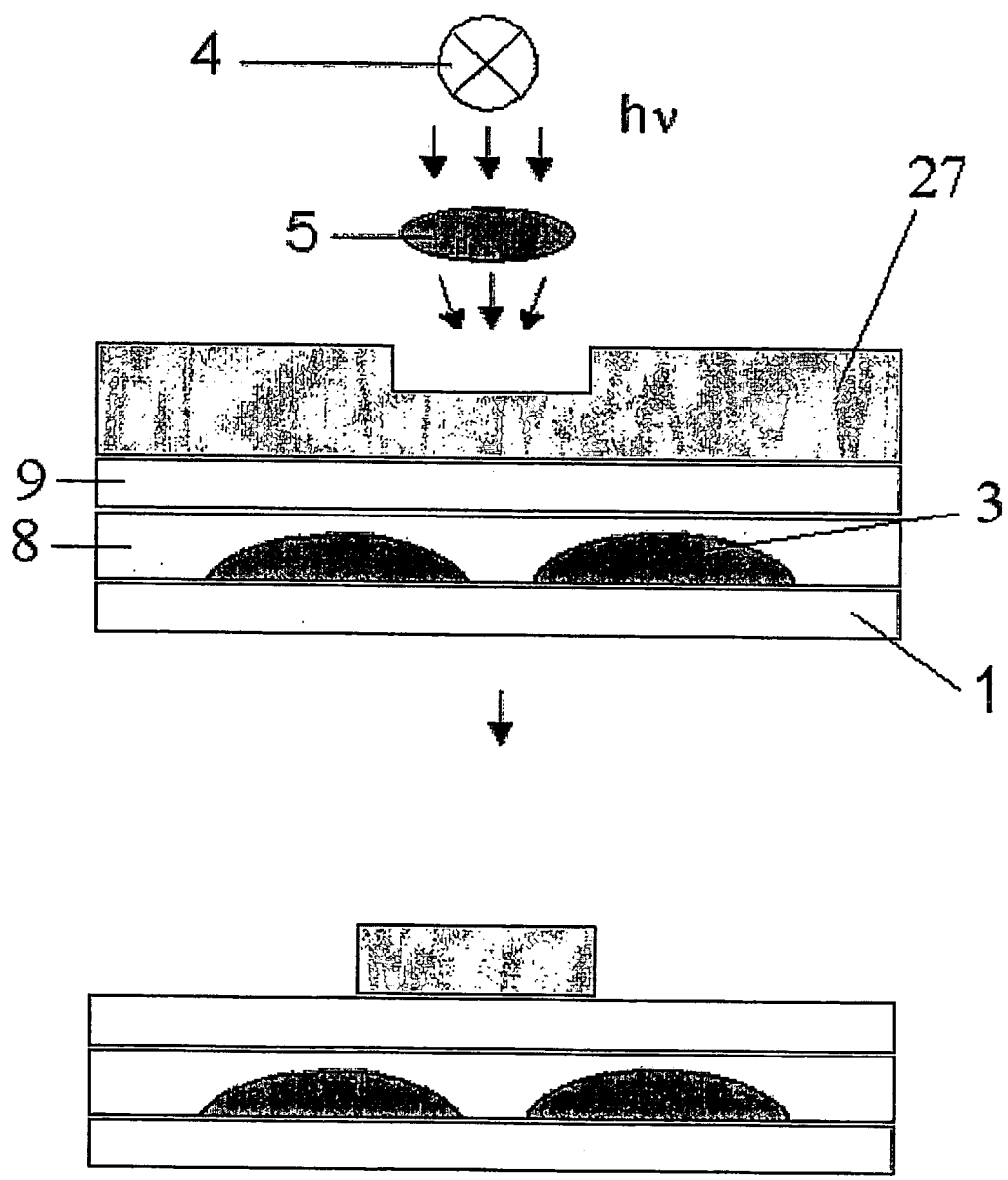

FIG. 14 illustrates direct writing of a conductive pattern by thermally induced annealing of a metal nanoparticle film.

Figure 15:
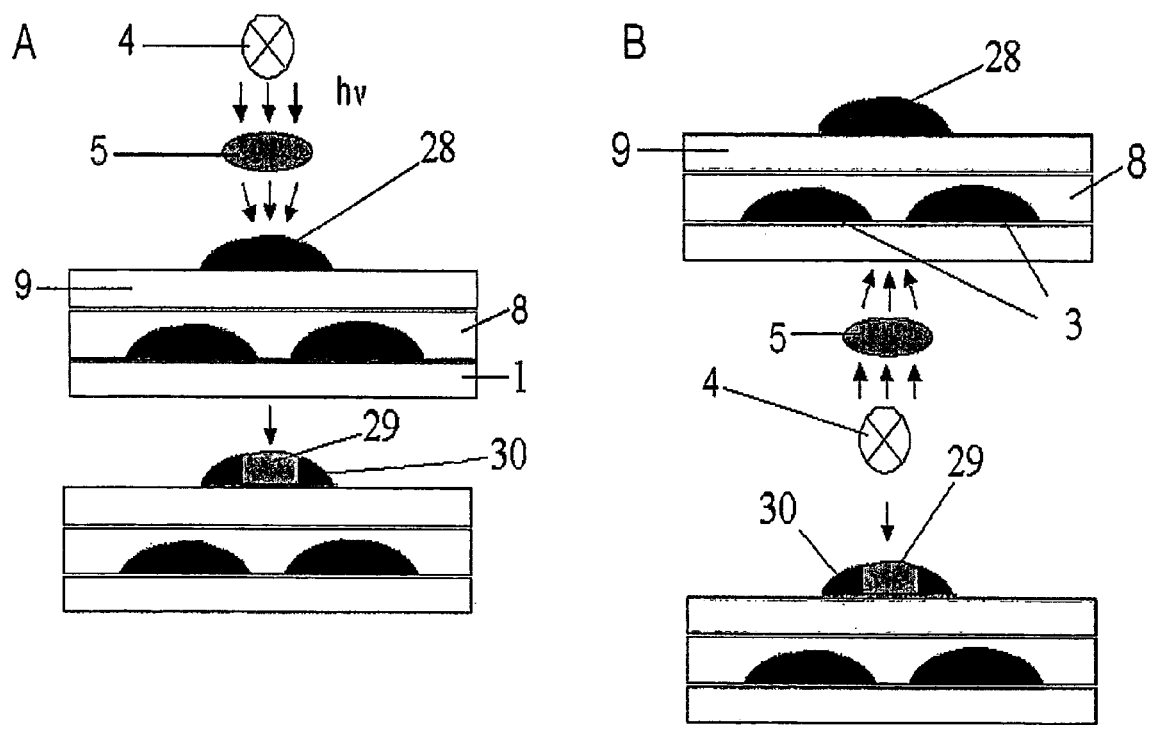

FIG. 15 shows direct writing of a conductive pattern by (A) thermally induced annealing of an inkjet printed line above a transistor channel structure and (B) self-aligned thermally induced gate annealing of an inkjet printed line using the source and drain as a shadow mask.

Figure 16:
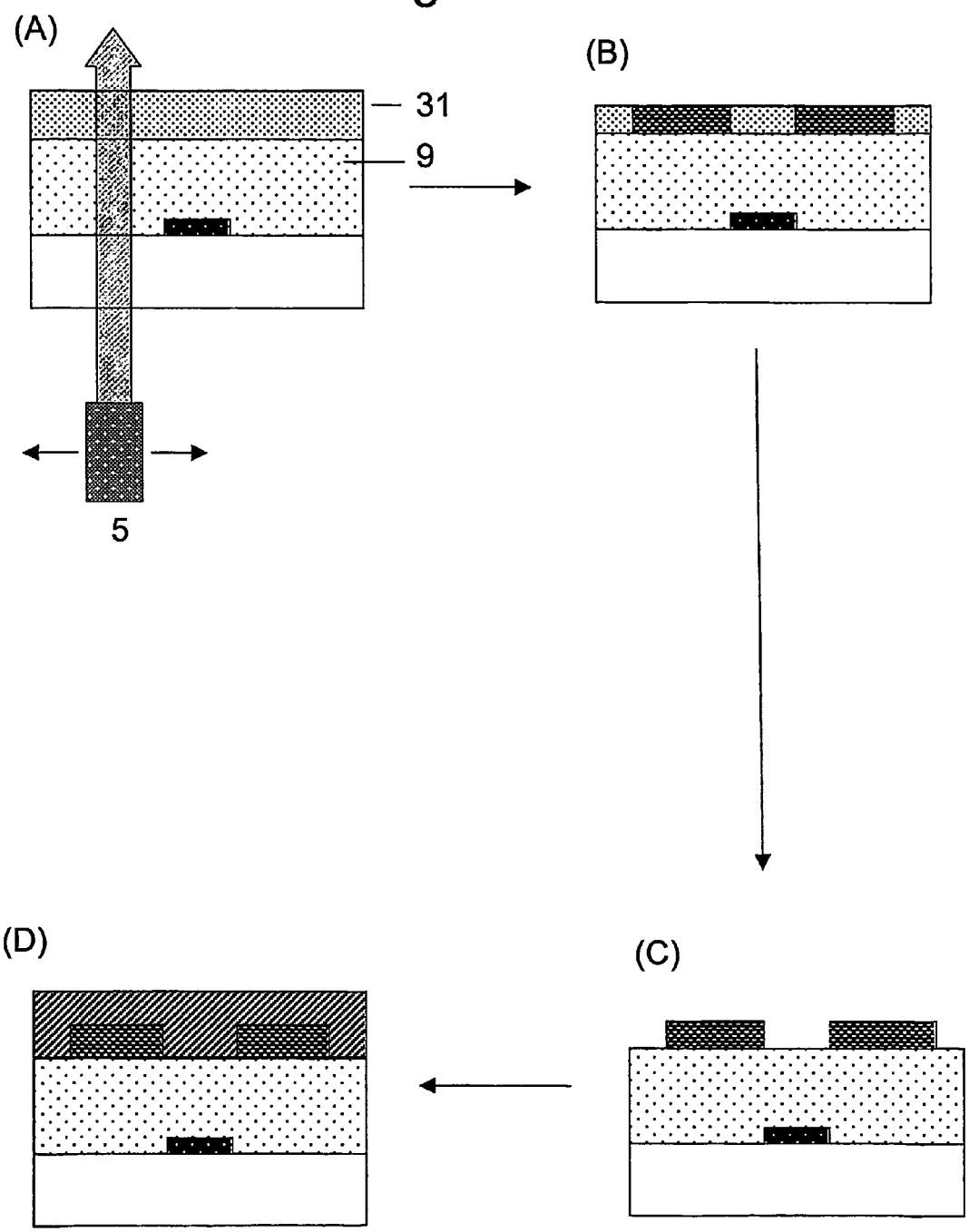

FIG. 16 illustrates a method of forming a bottom gate transistor comprising a photo-patternable conductive layer.

FIG. 17 shows optical micrographs of inkjet printed metallic nanoparticle TFT gate lines which have been annealed using a laser at different laser powers, alongside the TFT transfer characteristic after this annealing, showing degradation of the TFT trans-conductance at higher laser powers. Also shown is the variation in gate line conductivity with laser power.

Figure 18:
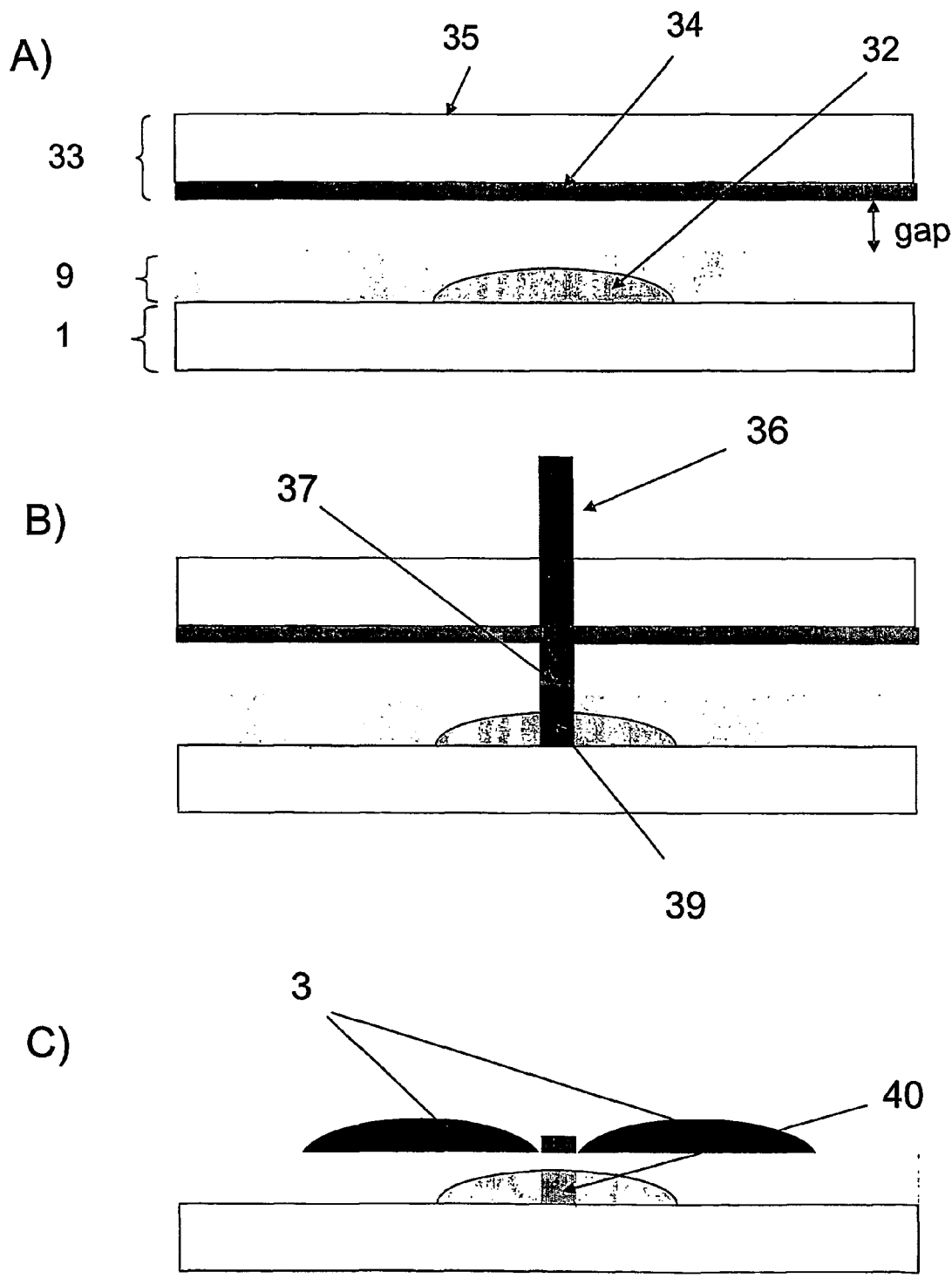

FIG. 18 shows a process for laser patterning of a surface energy modification layer which simultaneously results in self-aligned conversion of a portion of a previously deposited conductive line that is part of the multilayer structure of the substrate into a high conductivity form.

Figure 19:
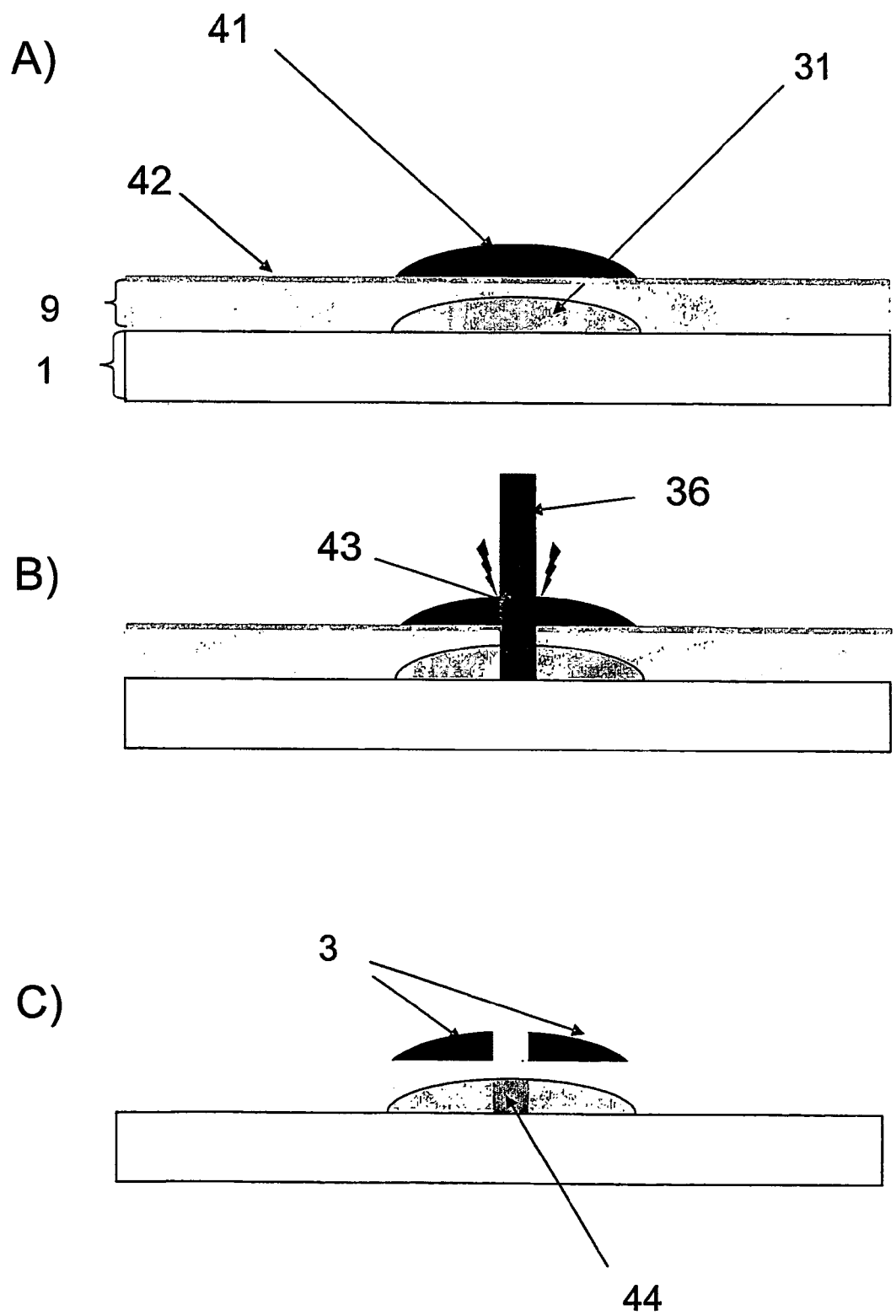

FIG. 19 shows a process for laser patterning by laser ablation of a conductive layer which simultaneously results in self-aligned conversion of a portion of a previously deposited conductive line that is part of the multilayer structure of the substrate into a high conductivity form.

Figure 20:
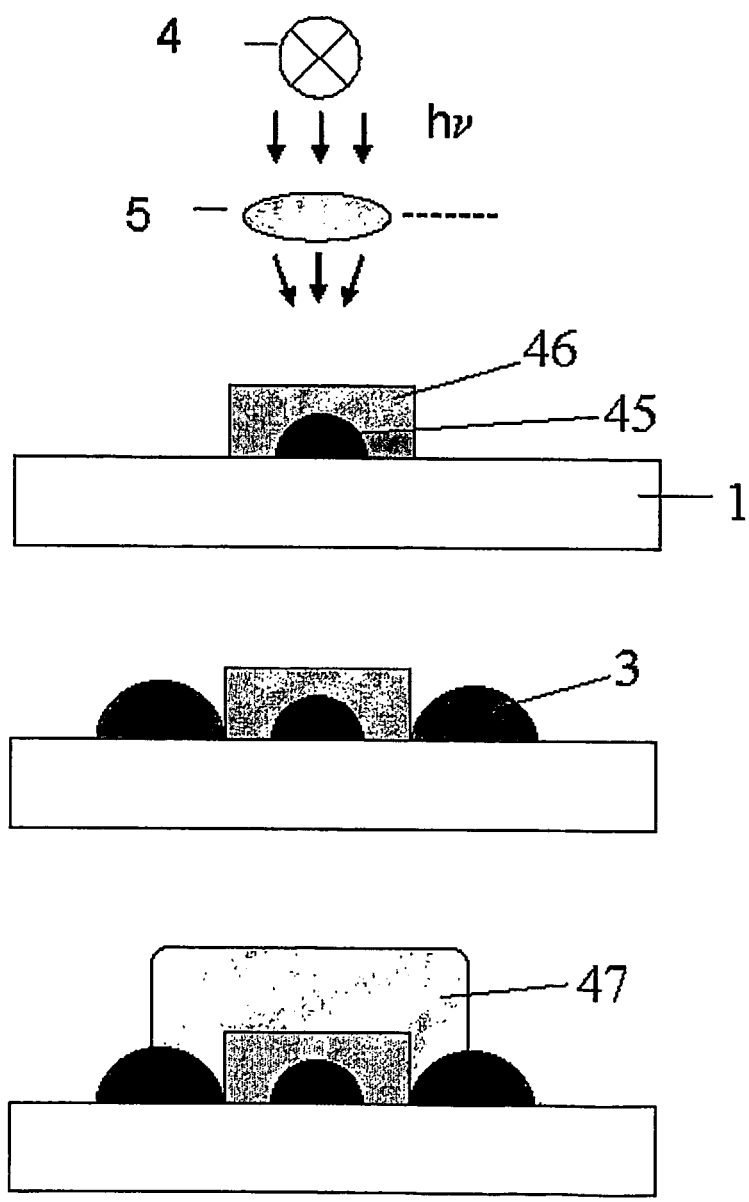

FIG. 20 illustrates a process of laser patterning of a surface energy modification layer that is part of a multilayer structure that does not require additional gate deposition steps.

Figure 1:
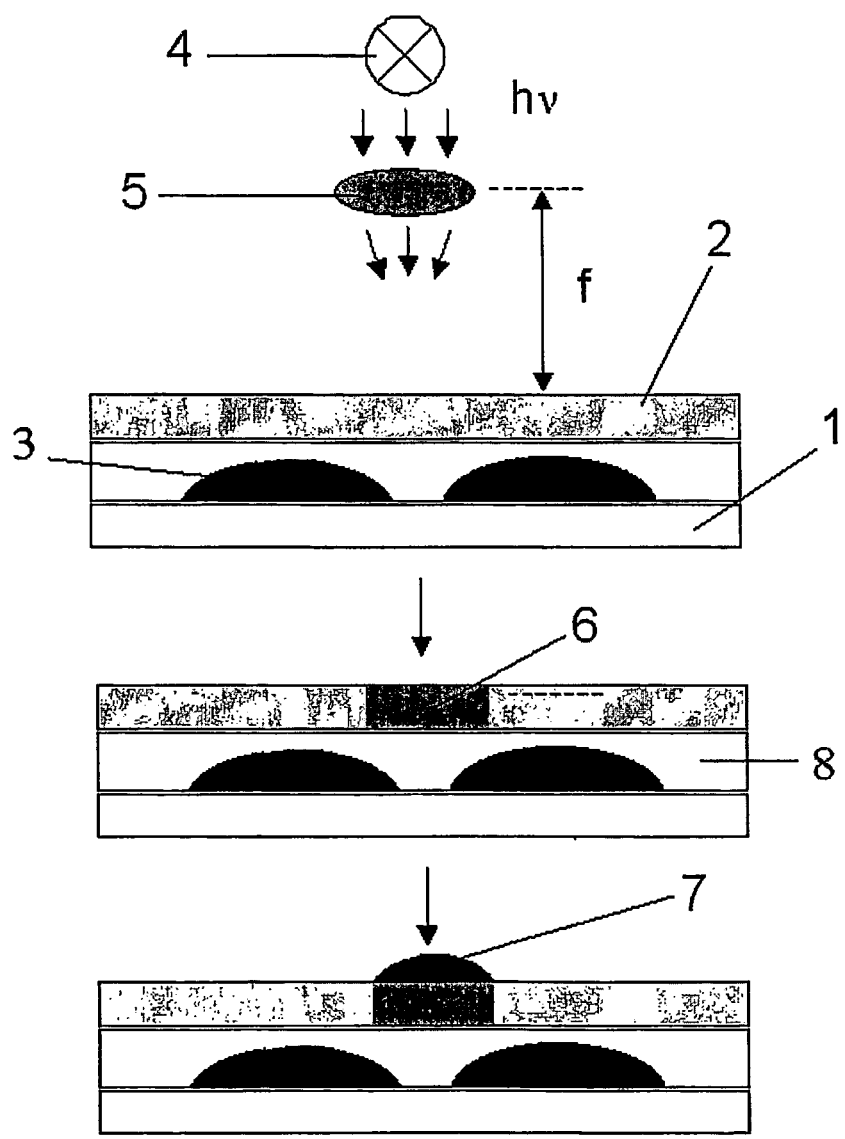
FIG. 1 shows a process for laser induced switching of the surface energy of thin film from hydrophobic/lyophilic to hydrophilic/lyophobic, or vice versa and subsequent formation of a patterned active layer of a transistor by direct materials deposition according to an embodiment of the present invention.

With reference to the drawings, the first embodiment of the present invention is illustrated in FIG. 1. The first embodiment is a surface energy assisted printing process, based on a light-sensitive materials system that switches its surface energy upon exposure to light. The 'switchable' material system may be a 'thermally switchable' one whereby light from the laser beam is absorbed by a material and converted into heat which induces a chemical reaction, or alternatively, a 'photoswitchable' one which induces a photochemical reaction. Both 'thermally switchable' and 'photoswitchable' reactions result in a change in the water attractive properties of the material. The materials system does not require additional treatment after light exposure, such as a development step to exhibit the desired surface energy contrast.

A substrate 1 is coated with a thin film of a switchable material 2. The substrate may be either glass or a polymer film. A switchable material is one that changes its surface energy when exposed to light/laser irradiation. Preferably, the switchable layer is coated from solution by standard thin film coating techniques, including but not limited to spin, dip, blade, bar, slot-die, or spray coating, inkjet, gravure, offset or screen printing. The switchable material changes its surface energy when exposed to light, for example in the form of a focussed laser beam 4 focussed through a lens 5, or alternatively of a pattern of light generated by passing a light beam through a shadow mask. This results in the surface energy patterning of the switchable layer. The surface energy of the switchable material is modified locally in a region 6 from hydrophobic to hydrophilic (or vice versa). This is achieved by focussing a laser on the surface to induce a light-induced chemical reaction, such as a deprotection, decomposition, cross-linking or curing reaction. Alternatively, thermal elimination or local hydrogenation may occur, or a light-induced surface chemical reaction with a gaseous, liquid or solid reactive species nears the surface, such as a photografting reaction. Subsequently, further material 7 is deposited onto the substrate from solution, in such a way that the deposition is affected by the surface energy pattern written by the light beam. The laser can be used to digitally image the surface energy of a substrate by rastering over the thin film and exposing selected regions, converting these regions from hydrophobic to hydrophilic, or vice versa. The resulting surface energy pattern can then be used directly to confine ink jet printed droplets and therefore define the areas of active components of a device. It is beneficial that these processes are carried out in an inert atmosphere in order to avoid degradation, such as oxidation.

Switchable materials are used for processless printing in the graphic arts printing industry, as discussed for example in U.S. Pat. No. 5,996,499 and U.S. Pat. No. 6,413,694. However, in graphic arts printing typical film thicknesses of the coating on a printing plate are on the order of several microns or less. In addition the switchable layers do not become incorporated into the final product (which in the case of graphic arts printing is a print), while in this embodiment at least a portion of the switchable material forms part of the final electronic device. Furthermore, there is no scope for degradation of the substrate during light patterning, because the process of fabrication of the printing plate is separate from the offset printing process, and the substrate does not contain any other light-sensitive layers that become incorporated into the final product. The application of known technology within the graphic arts printing industry, to the fabrication of electronic devices is therefore not easily achievable.

The switchable material does not require a further treatment such as a development step to exhibit the desired surface energy contrast. For example, the substrate does not need to be exposed to a liquid bath, which might cause degradation or delamination of certain layers in the multilayer structure on the substrate. For example, when dipping multilayer substrates in a development bath, delamination effects are often observed near the edges of the substrate or near particle defects on the substrate, which can lead to penetration of a development solvent into the multilayer structure.

It is preferable that the thickness of the switchable layer is less than 1 μm. In this embodiment of the invention the switchable layer remains on the substrate after the light exposure step, and forms part of the multilayer structure of the device. Therefore, it is preferred that the layer is sufficiently thin not to interfere with the operation of the device. As an example, the switchable layer might be used to define a surface energy contrast for the confined deposition of the gate electrode in a top-gate TFT. In this case the switchable layer forms part of the gate dielectric layer of the TFT (FIG. 2) or might even be used as the gate dielectric itself (FIG. 1). In both cases the thickness of the switchable layer is preferably less than 1 μm, most preferably less than 400 nm, in order to be compatible with low voltage operation of the TFT.

The switchable material may absorb the laser light directly. Alternatively, the thin film may contain a dye which absorbs the energy of the laser and converts it to thermal energy or generates a radical which then induces the chemical reaction. A relatively high loading of the switchable material with an absorber material may be necessary in order to achieve sufficient optical density at the same wavelength as that of the laser. This absorber material may be in the form of a dye. The optical density of the switchable layer at the wavelength of the laser is preferably larger than 0.3-0.5. Typical concentrations of dye incorporated into the switchable material are 1-20%. Preferably, the dye molecules are co-deposited with the switchable material by dissolving them in a common solvent.

The switchable layer may also contain a photoacid generator. Similar mechanisms to those seen in chemically amplified resists are able to enhance the sensitivity of the switchable material. This results in the desired change of the surface energy being achieved with a lower light intensity and irradiation time, and with a decrease in film thickness of the switchable material. Recent progress in electron-beam resists for advanced mask-making is disclosed in Medeiros et al. IBM J. Res. Dev. 45, (5), 639-650, 2001.

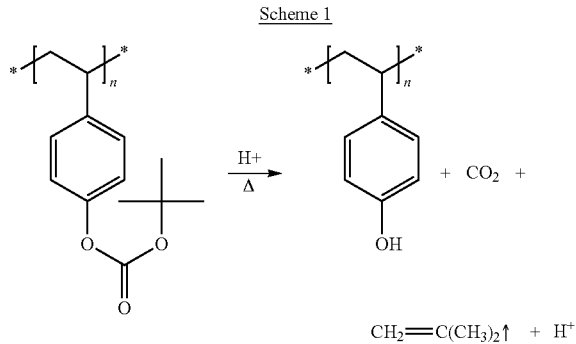

Scheme 1

Chemically amplified resists are based on deprotection mechanisms. An example is the catalytic deprotection of poly (tert-butoxycarbonyloxy)styrene (TBS) in which the thermally stable, acid-labile tert-butoxycarbonyl group is used to mask the hydroxyl functionality of the poly(vinylphenol). The reaction mechanism is shown in Scheme 1.

The irradiation with UV light of TBS films containing small amounts of onium salts, such as but not limited to, diphenyliodonium hexafluoroantimonate, liberates an acid species that upon subsequent baking, catalyzes the cleavage of the protecting group to generate poly(vinylphenol). While this reaction takes place slowly at room temperature, it proceeds at a faster rate at temperatures within the region of 100° C., requiring only a few seconds to reach completion. In the absence of an acid catalyst, degradation of the protected polymer does not occur, even during prolonged heating at these temperatures. The elimination of a tert-butoxycarbonyl group results in a large change in polarity in the exposed regions of the film. Whereas the substituted phenol polymer is a non-polar material that is soluble in non-polar lipophilic solvents, poly(vinylphenol) is soluble in polar organic solvents and aqueous bases. The change in polarity of poly(tert-butoxycarbonyloxy)styrene, resulting from irradiation with UV light, enables the switching of the surface from hydrophobic to hydrophilic. A photoacid generator or an acidic component along with a polymer, such as those described above, will be used in the present invention to achieve a similar change in polarity. The scheme is also compatible with longer wavelengths, for example infrared wavelength irradiation. Since feature contrast is required in the micron range, there is no foreseeable problem in the achievement of surface energy contrast within this dimensional range, as was discussed in Willson et al., JES, 1986, 133, 181.

Figure 2:
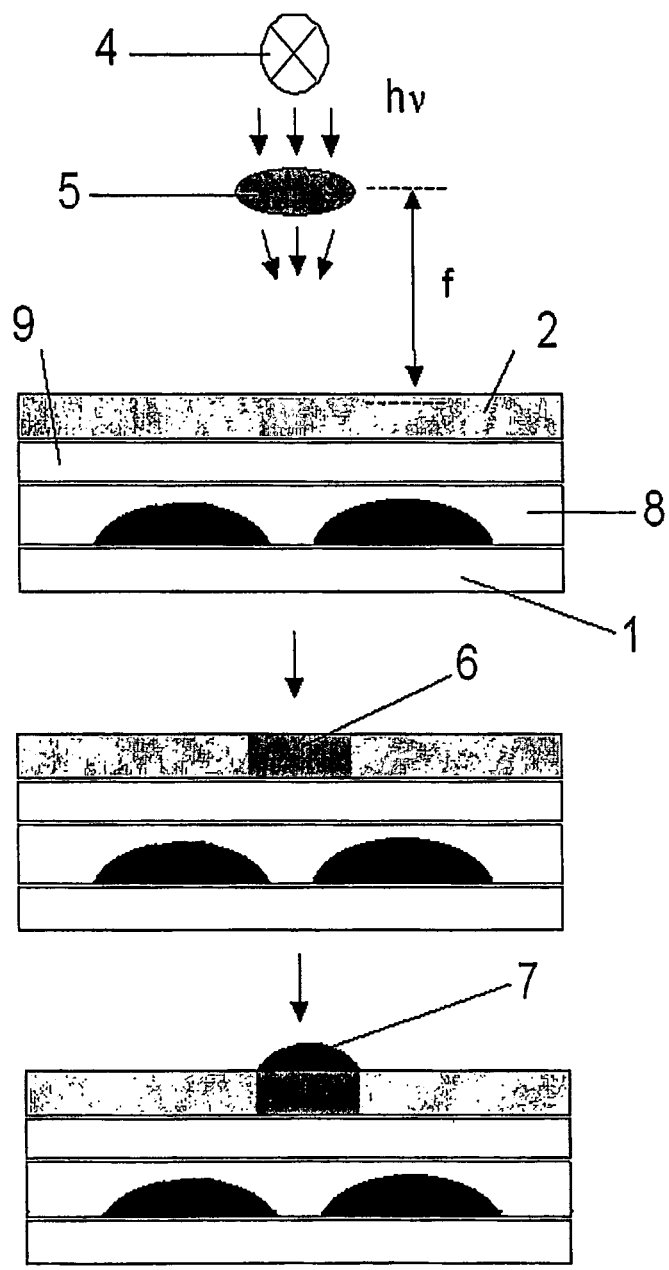
FIG. 2 shows a top-gate TFT with a double layer gate dielectric comprising a switchable layer and a high performance gate dielectric layer.

The performance of the TFT is very sensitive to the structure and electronic properties of the active semiconductor-gate dielectric interface. In a top-gate configuration, deposition of the gate dielectric 9 on top of the semiconducting layer 8 requires careful adjustment of the solvent of the dielectric layer in order to avoid dissolution or swelling of the semiconducting layer (see U.S. Ser. No. 10/176,007). For many switchable materials it might not be possible to optimize both their optical and surface energy properties as well as their dielectric properties at the same time. In such cases, a double-layer dielectric structure with a high performance gate dielectric in contact with the semiconducting layer and the switchable layer deposited on top can be used (FIG. 2). In this case care should be taken also to avoid solvent dissolution or swelling effects when the switchable layer is being deposited on top of the high performance dielectric layer. Preferably the switchable layer is thinner than the high performance dielectric layer.

Preferably, the contact angle of the switchable layer in both the hydrophobic and hydrophilic regions is stable when exposed to ink droplets. The deposited ink is confined to the hydrophilic regions by the surface energy contrast. Some switchable materials lose the surface energy contrast when exposed to water or organic solvents. This becomes a problem if the loss of surface energy contrast occurs on the same time scale on which the deposited ink droplets take to dry.

Preferably, the absorption characteristics and the surface energy properties of the switchable layer are chosen such as to minimize exposure of the active channel regions of the TFT to the laser light. Degradation of electroactive layers in the multilayer stack on the substrate can be avoided by one or more of the following techniques:

By choosing light of infrared wavelengths such as 830 nm or 1064 nm, the laser light is not being absorbed by most semiconducting layers, such as most conjugated polymer semiconductors with band gaps exceeding 1.6 eV. Other wavelengths in the visible and ultraviolet spectral range can also be used. In this case care should be taken to minimize exposure of the semiconducting layer to light, particularly in the presence of oxygen to avoid degradation by processes such as photooxidation.

Figure 3:
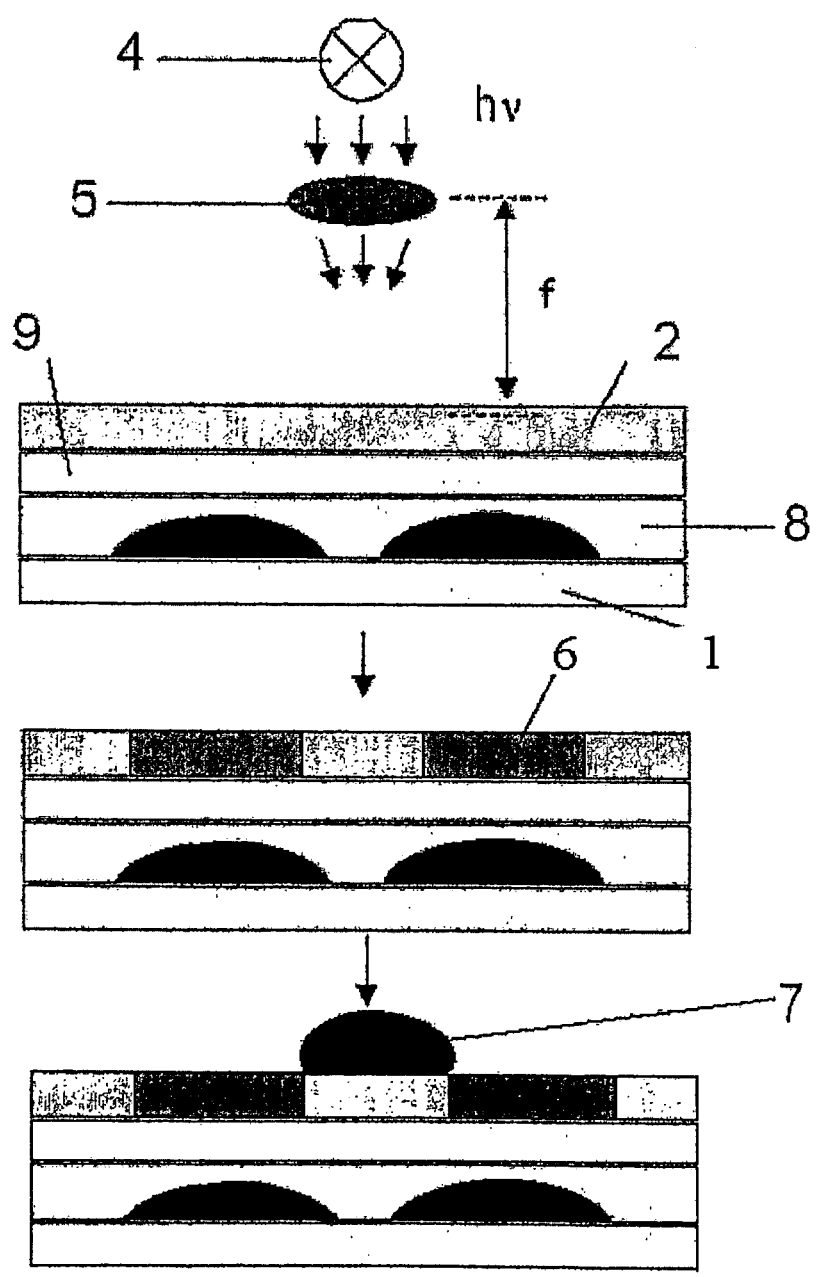
FIG. 3 illustrates a process for laser induced switching of the surface energy of a switchable layer avoiding exposure of the active region of the device to laser irradiation.

The switchable material can be chosen such that the region of its surface that needs to be exposed to the light beam to switch the surface energy is not located directly on top of an active layer, such as a TFT channel, and is positioned in any of the underlying layers. For example, in the case of gate patterning for a top-gate TFT, a switchable material can be chosen that has a hydrophilic surface when deposited, and can be turned into a hydrophobic surface by light exposure. In this case the light beam writes two confinement boundaries 6 to both sides of the gate electrode line, which are located on top of the source-drain electrodes, but not on top of the active channel region of the TFT (see FIG. 3). Analogously, for the source-drain patterning in a bottom-gate TFT a switchable polymer can be chosen that is hydrophobic in its as-deposited form, but can be converted into a hydrophilic form by light exposure.

In the case of infrared light, where the conversion of the switchable layer involves heating of that layer by the beam, the multilayer structure on the substrate can be made to contain at least one layer with a small thermal conductivity in order to minimize heating of the underlying layers. For example, in the case of a double-layer gate dielectric for a top-gate TFT the high-performance gate dielectric in contact with the semiconducting layer can be chosen to be of low thermal conductivity to minimize heating of the semiconducting layer underneath. Furthermore, the optical properties of this heat blocking layer are chosen such that no or little light absorption occurs inside it.

The light beam used for the writing of the surface energy pattern is chosen to be a high intensity pulsed beam, such as a nanosecond pulsed laser beam. During the short exposure time only the switchable layer which is designed to absorb the laser light stronger than any of the other layers is heated. The heat diffusion of the switchable layer is not sufficiently fast to significantly heat up any of the underlying layers of the substrate during the short exposure time.

Scheme 2

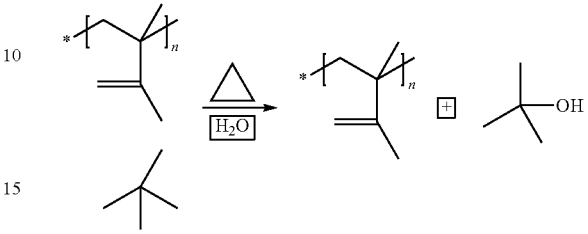

An example of a switchable material for use in this embodiment is poly(tert-butylmethacrylate), a polymer which forms as-deposited thin films that are hydrophobic and can be converted to the hydrophilic poly(methacrylic acid) form by local heating with an infrared laser beam. The absorption of the laser light is enhanced by mixing an infrared laser dye into the solution from which the poly(tert-butylmethacrylate) is deposited. The laser-induced heating causes the thermal hydrolysis of the ester bond which makes the film locally hydrophilic (see Scheme 2).

Scheme 3

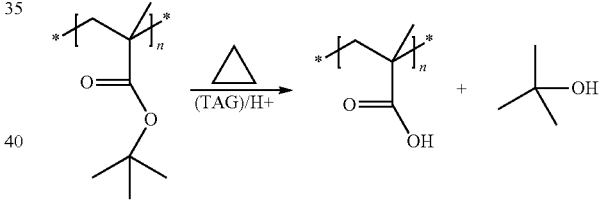

In contrast to the photoacid generator technique described above (see Scheme 1), the present concept seen in Scheme 3 uses a thermally initiated acid release to switch the surface energy, as opposed to a photochemical reaction. A thermal acid generator (TAG) and a suitable dye is contained within the switchable layer and an acidic environment is created by the release of H+ ions upon exposure to the laser beam, due to heat generation. Examples of thermal acid generators may be, but are not restricted to, sulfonic acid compounds with amines or quarternary ammonium triflates.

Another example of a switchable material is poly(trimethylammoniumethylmethacrylate bromide), a polymer which forms hydrophilic films and can be converted to the more hydrophobic poly(dimethylaminoethylmethacrylate) upon heating with an infrared laser beam, as is shown in Scheme 4. The laser induced heating causes the recombination of the anion with its counter ion to yield an uncharged polymer. These types of materials have been previously developed in the processless printing plate industry and are disclosed in U.S. Pat. No. 6,190,830 B1.

Scheme 4

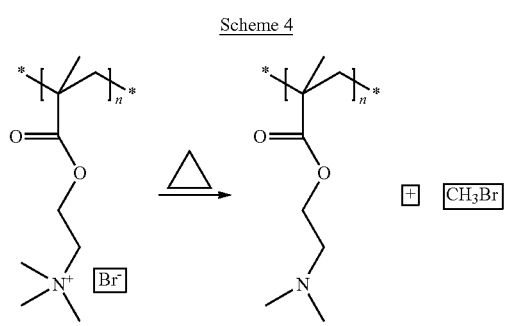

The temperature that is required to thermally switch the surface energy of a layer of poly(tert-butylmethacrylate) has been determined by thermally annealing a thin film of poly(tert-butylmethacrylate) on top of a glass substrate. The water contact angle of the deposited film was measured to be in the region of 92°. After annealing to 300° C. a reduction of the contact angle to 8.5±3.1° was observed.

A further example of a class of switchable materials is observed in a class of polymers having an acidic anhydride backbone. An anhydride backbone is able to be converted to an acid upon exposure to an aqueous media. The resulting acidic backbone is then able to be converted back to the anhydride backbone by thermal dehydrogenation. The reaction mechanism is illustrated in Scheme 5. The resultant anhydride formed upon thermal elimination is stable for the duration of the time required for the printing of the water based ink.

Scheme 5

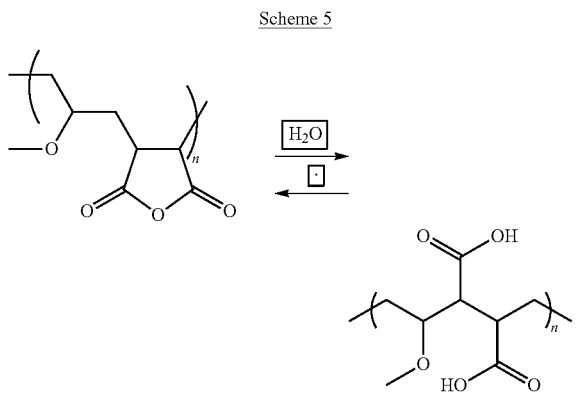

An example of such a material described above is an alternating co-polymer, such as methyl vinyl ether and maleic anhydride. If the film is coated from water, a diacid will be formed as a result of the hydration reaction of the anhydride. This will occur without a loss in molecular weight of the polymer. If the diacid film is exposed to high temperatures, the polymeric anhydride would be reproduced in a non-water soluble form. The reaction time of the hydration reaction depends on the surface area of interaction between the polymer and the water molecules. This reaction process is generic to any acid anhydride polymer. The thermal activation of the surface energy can be achieved by mixing a dye with the polymer. The advantage of this technique is that a drop of water based conducting ink (for example PEDOT) will be selectively confined to the hydrophilic region. In addition, the transistor channel is not exposed to the laser radiation. This prevents any degradation effect associated with exposure to the laser beam.

FIG. 4 shows optical micrographs of a substrate with a hydrophobic film of poly(tert-butylmethacrylate) which has been selectively switched to hydrophilic in the regions of the film patterned by a laser beam with a wavelength of 830 nm wavelength.

As previously seen in FIG. 2, a variation of this embodiment features a double dielectric top gate configuration. A dielectric with a low dielectric constant (k) increases the mobility in the TFT and reduces hysteresis. However, dielectrics with a high dielectric constant have a high polarity and therefore high energetic disorder. Therefore, in order to maintain a low mobility, but decrease the polarity at the dielectric/semiconductor interface, a dielectric of low energetic disorder and therefore a high dielectric constant (k) is preferred as a first dielectric layer. An example of a double layer gate dielectric for a top-gate TFT is a double layer comprising a 400 nm high-performance gate dielectric layer of a fluorinated polymer deposited from a fluorinated solvent, such as Teflon AF deposited from a fluorinated solvent, and a 300 nm switchable layer of poly(tert-butylmethacrylate) deposited from cyclohexanone, containing an infrared dye absorbing at 830 nm. A suitable semiconducting layer for this combination is poly(dioctylfluorene-co-bithiophene) (F8T2). The Teflon AF layer enables a high field effect mobility at the active interface, and poly(tert-butylmethacrylate) provides sufficient surface energy contrast when patterned with an infrared laser beam at 830 nm to confine the deposition of water based, conductive ink for the gate electrode material. Examples of suitable gate electrode materials deposited from water based solutions/dispersions are the conducting polymer PEDOT/PSS or printable inorganic nanoparticles of silver dispersed in water.

Figure 5:
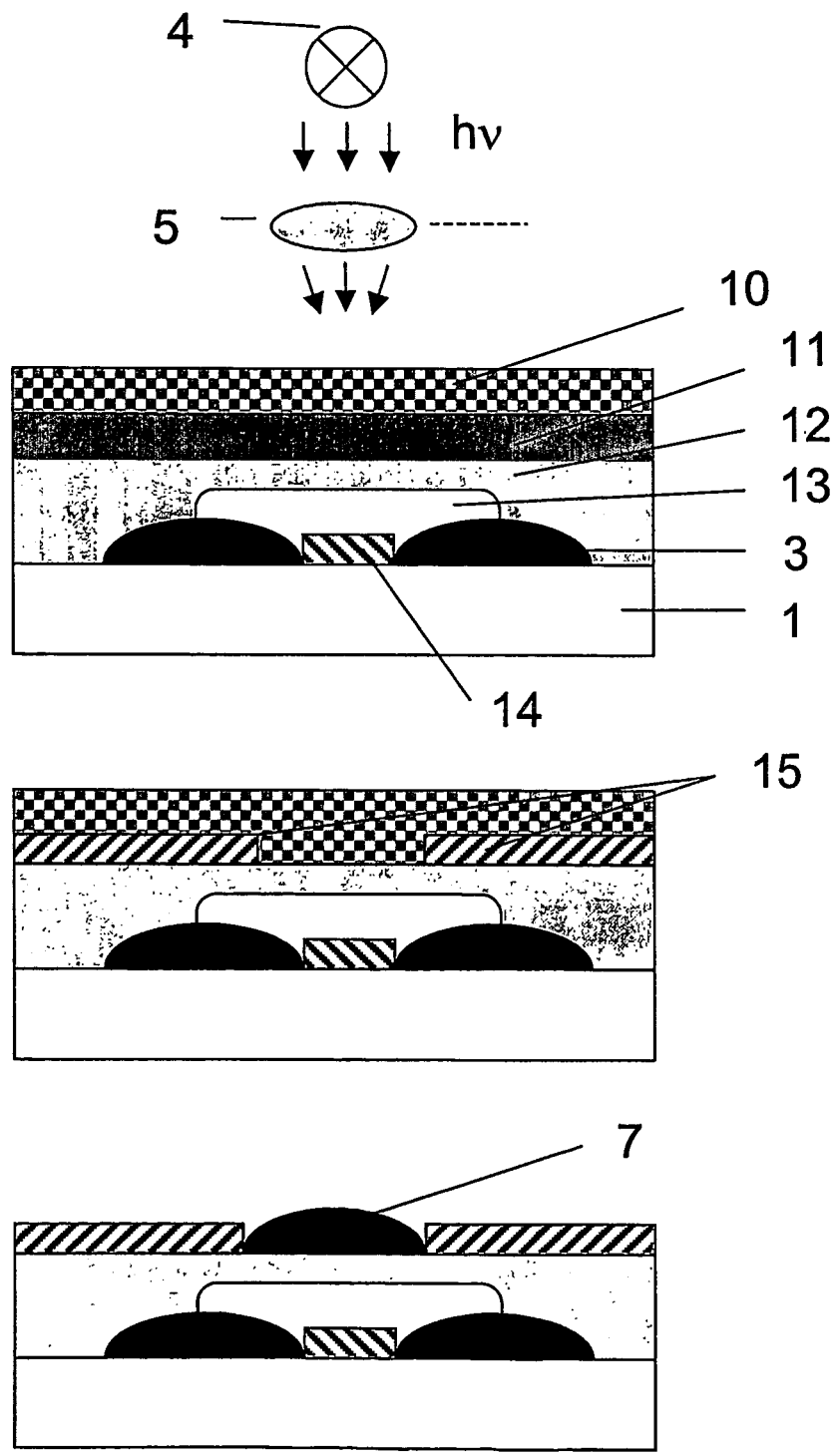
FIG. 5 shows a process of direct laser writing of a surface energy pattern by light absorption in a sacrificial light absorbing layer and heat transfer to a surface energy patterning layer.

Another embodiment of the present invention uses a sacrificial light absorbing layer 10 with a high optical density to define a pattern in a multilayer structure of functional electronic materials. According to this embodiment (FIG. 5) the absorbing layer is a polymer layer comprising a dye which absorbs the incident light radiation. The absorption causes local heating of the underlying layer 11 in contact with the light absorbing layer and by heating modifies the physicochemical properties of the underlying layer. In a subsequent step the absorbing layer is washed off the substrate and the pattern 15 generated by heating in the underlying layer can be developed.

Such a polymer layer may consist of PVP (polyvinylphenol), which absorbs at 200 nm and a dye (such as SDA4927) which absorbs strongly at 830 nm. In the present case, the polymer layer is able to be deposited through techniques such as, but not limited to spin-coating, onto the substrate and underlying layers. A layer of dielectric is deposited directly underneath the polymer layer, and is preferably BCB (benzocyclobutene), which absorbs at 260 nm. The laser beam is focussed on to the PVP/dye layer, which generates heat. The heat generated is able to be transferred from the PVP/dye layer to the underlying BCB layer through intimate contact between the two layers, resulting in the curing of the BCB layer. When heated, the chosen hydrophobic dielectric layer is capable of cross-linking. After imaging, any remaining PVP/Dye is developed in methanol, and the BCB cured pattern may be developed in a solvent of xylene.

In one variation, the absorbing layer 10 is an ultra-thin layer of laser light absorbing dye molecules with high optical density onto the surface layer of the device (FIG. 6). The dye molecules are locally desorbed from the substrate upon light exposure to uncover the surface of the underlying substrate 16, and in this way to define a surface energy pattern, which is then used subsequently for the accurate definition of an electroactive layer of the device.

The layer of dye molecules 10 is desorbed from the substrate in the regions where it is exposed to an intense focussed laser beam 4, and uncovers the underlying substrate 16. The process of desorption may occur by ablation or vaporisation. A surface energy pattern is generated when a substrate is chosen that has a different surface energy from the surface of the layer of dye molecules. Preferably, the dye will strongly absorb the energy imparted by the laser such that the imaging time will be kept to a minimum. After the laser has patterned the dye layer a solution-processing step is performed, whereby an electroactive material 7 is deposited on the substrate but is able to wet either only the bare substrate regions 16 or the dye layer covered regions 10 and is thereby confined to areas patterned by the laser. An example of the application of this technique to the fabrication of an organic TFT is the patterning of the gate electrode and interconnects.

The use of a layer of dye molecules has the following attractive attributes for the definition of a surface energy pattern:

- In this case the light sensitive layer of dye molecules can be optimised mainly to exhibit a high optical density at the wavelength of the laser beam. The film may have a high density of dye molecules to a high volume fraction. In a preferred aspect of this embodiment the layer comprises 100% of dye molecules. This results in a high optical density for a film while keeping the film thickness to a minimum.
- By choosing the laser wavelength and the corresponding absorption energy of the dye molecules to be in an energy range where the predeposited electroactive layers do not absorb light, it can be ensured that light absorption only occurs in the dye layer. These predeposited electroactive layers form part of the multilayer stack on top of the substrate. In this way light-induced degradation of the other layers of the device is avoided. For example, by choosing light of an infrared wavelength such as 1034 nm or 830 nm, and a corresponding infrared dye, the underlying semiconducting and dielectric layers that are most prone to light-induced degradation, are not affected by the light patterning step.
- A layer of dye molecules achieves a high optical density, while minimising the thickness of the layer. For many device applications it is important that the thickness of the layer, defining the surface energy pattern is minimised compared to the thickness of the other electroactive layers of the device. Patterned films that are too thick can cause conformation problems with solution coatings of subsequent layers that might affect the electrical operation of the device. For example, in the case of surface energy patterning for source-drain definition, a thick surface energy barrier defining the channel of the device tends to enhance the source-drain parasitic contact resistance.
- The formation of a very thin dye layer also minimizes contamination of the substrate by ablated or evaporated materials that are re-deposited accidentally in other regions of the substrate. If the dye layer has a thickness of several micrometers, as is common for applications in the graphic arts printing industry, the contamination of the substrate by ablation residue would be a significant problem for fabrication of electronic devices.
- The polarity of a solution processible dye molecule can be tuned by attachment of solubilising polar or non-polar side-chains respectively. By using the appropriate combination of a polar (or non-polar) dye and a non-polar (or polar) substrate surface layer, the laser patterning can be adjusted such that the areas of the dye layer that are exposed to the laser and desorbed from the substrate are not overlapping with any active channel region in the underlying layers, i.e. the channel region of the device remains covered with a layer of dye. For a top-gate TFT, and a polar dye on top of non polar substrate, the surface of the unexposed channel region is hydrophilic, and therefore will attract ink of a subsequently deposited gate electrode material, which is confined by the non-polar substrate surface regions uncovered by the laser ablation process in the regions adjacent to the gate line.

Preferably, the ultrathin dye layer is deposited onto the surface of the substrate from solution or vapour to yield a continuous thin layer. The dye layer might also contain a certain volume fraction of other materials such as, for example a polymer binder layer in order to improve the film forming properties of the dye layer. The volume fraction of such binder material is preferably kept as small as possible in order to achieve the maximum optical density for a given film thickness of the dye layer.

Preferably, the ultrathin dye layer has a thickness of less than 50 nm with an optical density in excess of 0.3. This ultrathin dye layer may either be composed of 100% dye, or the dye might be dispersed in a binder material such as a thin polymer film. One example of this might be to spin an ultrathin film, on the order of several nanometers, of a polymer such as poly(vinylphenol) which has a very high density of dye molecules, preferably above 50% and more preferably above 70%.) Preferably the dye layer consists of an infrared dye and upon exposure to the light beam, the latter is converted to heat.

The dye may be attached to the surface of the substrate, in an essentially covalent character, in the form of a self-assembled monolayer (SAM). The dye may consist of a head group that is capable of binding to a functional group on the substrate and a tail group that incorporates a light absorbing unit. An example of such a monolayer might be an alkylthiol, a perfluorinated alkylthiol, or a perfluorinated alkyltrichlorosilane, with a dye unit covalently attached to it. The interaction of the SAM with the substrate surface is preferably a weak interaction to enable a breakdown of the bonds between the SAM and the substrate surface.

Another embodiment of the present invention is a process for forming a self-aligned electrode, which is based on defining a pattern of first conductive, semiconductive, or surface energy modification layer on the substrate, depositing a series of other materials on top, and patterning a second conductive, semiconductive, or surface energy modification layer by exposing the substrate to a light beam of a wavelength that is strongly absorbed in the material of the first conductive, semiconductive, or surface energy modification pattern, resulting in local heating of the layer structure on top, such that a local change in the physical or chemical properties of the second conductive, semiconductive or surface energy modification layer is induced, that results in self-aligned patterning of the second conductive, semiconductive or surface energy modification layer. The light beam is preferably an infrared light beam. The process is particularly useful for forming bottom gate TFT structures.

A self-aligned bottom gate configuration will enable the fabrication of thin film transistors with small channel lengths, in the region of 10 μm, to be achieved in which the boundaries of the top electrodes, forming the source and drain, are self-aligned to the boundaries of the bottom gate electrode. For a bottom gate structure, the simplest coplanar arrangement is achieved by depositing and/or patterning the gate onto a substrate followed by the deposition of the dielectric, the source and drain electrodes and the semiconductor in succession. The embodiment below discloses a bottom gate configuration which lends itself to the fabrication of transistors where the channel lengths are small (less than 20 µm-30 µm) and the top electrodes are printed and self-aligned to the bottom (gate) electrode.

In a variation of this embodiment (see FIG. 7), a solution-deposited conducting polymer or printable metal which forms the gate electrode 7 of the device, is deposited onto a substrate 1 that has been pre-patterned to provide surface energy confinement of the conductive ink and achieve a linewidth smaller than 20-30 µm. A printable metal ink may be based on nanoparticles such as silver or gold suspended in a solvent. A conducting polymer gate electrode may consist or PEDOT/PSS, polyaniline or other conducting polymer materials. An insulating layer or first dielectric layer 9 may be deposited over the gate electrode from solution using techniques such as, but not limited to, spin coating, slot die coating, spray coating, ink jet printing or dip coating. The first dielectric is preferably a spin-on-glass (SOG), a silesquioxane resin, or a high performance polymer dielectric such as polyisobutylene, PMMA or polystyrene. The deposition of the dielectric at this early stage in the fabrication process allows a further process of curing to be undertaken, resulting in an increase in dielectric properties. A preferable curing process may be, but is not limited to, UV irradiation or thermal annealing. In comparison, in a top gate configuration, such a curing process can have harmful effects to the electronic properties of underlying materials.

A second dielectric layer 2 of a thermally switchable dielectric may be deposited on the first dielectric layer 9. The substrate is then irradiated with light, either by scanning a focussed beam of light across the substrate, by exposing the substrate through a suitable shadow mask, or simply by exposing the whole substrate to light. The wavelength of the light is chosen such that the light is not strongly absorbed by the dielectric layers 9 or 2, but primarily by the metal gate electrode 7. This can be achieved by using laser light of infrared wavelength, for example light of 830 nm or 1034 nm wavelength. The infrared light is strongly absorbed by the free carriers in the metal resulting in an increase of the temperature of the metal. Due to this temperature increase in the vicinity of the gate electrode the regions of the second dielectric 6, directly above the gate electrode 7, experience a change in water attractive properties and become hydrophobic. This change in physical property will render this region dewetting to the deposited conductive ink (PEDOT/PSS), and will be of the same dimensions as the gate electrode, forming the channel of the TFT. A suitable dielectric which acquires a lower surface energy upon thermal treatment is poly(trimethylammoniumethylmethacrylate bromide). The resultant source and drain will then be printed and confined to the unchanged hydrophilic region of the second dielectric and will be self-aligned to the gate electrode.

The first dielectric layer 9 is chosen to achieve the required dielectric properties such as a low leakage current or good electrical breakdown characteristics, while the second dielectric properties apart from its thermally induced surface energy switching characteristics is chosen to provide a high quality interface with the subsequently deposited active semiconducting layer. Apart from the self-alignment feature, another advantageous feature of this embodiment of the invention is that in order to heat the thermally switchable second dielectric layer 2 it is not necessary to mix the layer with an absorbing dye, such as an infrared dye, since the light is absorbed by the underlying metal and not by the dielectric layer itself. The presence of a dye molecule in the dielectric layer immediately adjacent to the semiconducting layer may adversely affect the performance and operation stability of the device.

In another variation of this embodiment, the first dielectric layer is omitted, and a single-layer dielectric is used that has both thermal switching and good dielectric characteristics. Examples of these compounds are non-vinyl polymers comprising recurring organoonium groups, such as poly(trimethylammoniumethylmethacrylate bromide). Alternatively, compounds containing pendant N-alkylated aromatic heterocyclic groups may be used, as disclosed in U.S. Pat. No. 6,190,831.

In another variation of this embodiment, the second dielectric 17 is a dielectric which forms a 3-dimensional, crosslinked network structure and becomes insoluble 18 when exposed to the heat generated by the absorption of the light beam in the gate electrode. A suitable polymer is BCB (benzocyclobutene) (see FIG. 8). BCB may preferably be deposited from mesitylene solution but hexane may also be used as a solvent. Alternative suitable materials for the second dielectric are polyimide, crosslinkable polyolefin resins, or novolac based photoresists. Spin on glasses (polysilsesquioxanes) with a high methyl and phenyl content can be added to increase the hydrophobicity of the photoresist by significantly decreasing the water attractive properties. The interface between the semiconductor and the second dielectric is crucial to the performance of the TFT. The substrate is exposed to light/laser irradiation 4 in the region of 830 nm. This wavelength allows the radiation to penetrate the substrate and be absorbed by the gate electrode, resulting in the curing of the second dielectric layer, comprising of BCB. A careful choice of the right combination of materials and light source producing a beam of a suitable wavelength should be made. The material of the first dielectric should be thermally stable at the temperature required for the curing of the second dielectric. The source of the beam of light, preferably a laser, should be of a suitable power such that the heat is absorbed in the second dielectric without causing any ablation. The region of the second dielectric, directly above the gate electrode, experiences a change in physical properties, possibly, but not limited to, resulting from cross-linking within the polymeric material. Regions of the second dielectric which do not absorb the radiation are able to be dissolved away by the means of a developing process, leaving a cured layer of the second dielectric in the channel region of the TFT overlapping with the gate electrode. The first dielectric is chosen such that its surface is more wetting to the ink of the subsequently deposited source-drain electrode inks than the surface of the thermally cured second dielectric layer. A suitable material for the first dielectric in combination with BCB is SOG or polyvinylphenol. In this way, self-aligned source and drain electrodes 3 can subsequently be deposited from solution and the channel length can be defined accurately and in a self-aligned fashion by the surface energy barrier formed by the cured second dielectric above the gate electrode. Another example of a thermally cross linkable dielectric layer is a novolac based resist. It is possible to decrease the water attractive properties of the photoresist by the addition of a small percentage of SOG. Addition of between 10 and 40 percent by weight SOG to the photoresist results in an increase in the water contact angle of the thermally cured resist surface such that it is more dewetting to the ink of the subsequently deposited source-drain electrodes than the surface of the first dielectric. Finally a semiconducting active layer island 13 is deposited.

A general condition which should be satisfied in order to achieve sufficient local heating of the heat switchable or heat convertible layer on top of the gate electrode is to minimize the lateral heat conduction in the gate electrode deposit. Lateral heat conduction in the gate electrode can degrade the definition of the image and can reduce the amount of heat which is transferred to the layer structure on top of the gate electrode. This can be achieved by limiting the linewidth of the gate electrode, adjusting the scanning direction of the laser beam with respect to the electrode direction (more heat transfer for scanning parallel to the electrode line than for scanning perpendicular to the electrode line) or by using a gate electrode material with a small thermal conductivity, such as a conducting polymer. Therefore, a long narrow gate electrode can achieve a higher temperature with more heat being transferred to the layer structure on top of the gate electrode, than a wider line that is heated only down the centre of the line.

The same principle can be applied analogously to self-aligned formation of a top-gate device (FIG. 9). In this case the laser radiation is absorbed in the source and drain electrodes, but not in the channel region, and a hydrophobic surface energy pattern 18 is formed in the second dielectric. Analogously, a thermally switchable second dielectric can be used.

In another variation of this embodiment of the invention, the layer which is heated selectively by the laser in the region above the gate electrode to change its physico-chemical properties is a precursor semiconducting layer that can be converted into its semiconducting form by heating. First a solution-deposited conducting polymer or printable metal ink which forms the gate electrode of the device is deposited onto a substrate that has been pre-patterned to provide surface energy confinement of the printable metal ink and achieve a linewidth smaller than 20-30 µm. A printable metal ink may be based on nanoparticles such as silver or gold suspended in a solvent. A dielectric layer or a sequence of dielectric layers is then deposited over the gate electrode from solution using techniques such as, but not limited to, spin coating, slot die coating, spray coating, ink jet printing or dip coating. The dielectric is preferably a spin-on-glass (SOG), a silesquioxane resin, or POSS (polyhedral oligomeric silsesquioxane). The deposition of the dielectric at this early stage in the fabrication process allows a further process of curing to be undertaken, resulting in an increase in dielectric properties. A preferable curing process may be, but is not limited to, UV irradiation or thermal annealing. In comparison, in a top gate configuration, such a curing process can have harmful effects to the electronic properties of underlying materials.

Then the precursor semiconductor material is deposited on the dielectric layer. The substrate is then irradiated with light, either by scanning a focussed beam of light across the substrate, by exposing the substrate through a suitable shadow mask, or simply by exposing the whole substrate to light. The wavelength of the light is chosen such that the light is not strongly absorbed by the dielectric layer 9 or by the precursor semiconductor layer 13 but primarily by the metal gate electrode 7. This can be achieved by using laser light of infrared wavelength, for example light of 830 nm or 1034 nm wavelength. The infrared light is strongly absorbed by the free carriers in the metal resulting in an increase of the temperature of the metal. In the case of the conducting polymer the absorption arises due to the polaronic charge-induced absorption transitions in the infrared. Due to this temperature increase in the vicinity of the gate electrode the regions of the precursor semiconductor layer, directly above the gate electrode are converted into their semiconducting, fully conjugated form. At the same time the annealed region of the layer becomes insoluble in many organic solvents, in which the precursor form is soluble, and also acquires a low energy surface. Next, the unheated regions of the precursor material are washed away in the solvent in which the precursor material is soluble, but not the converted material above the gate electrode. During this development step the semiconducting layer is patterned, and the underlying surface of the dielectric layer 30 is exposed. The difference in surface energy properties between the exposed surface of the dielectric and the converted semiconducting layer can be used for self-aligned, high resolution surface energy assisted printing of the source-drain electrodes (for example consisting of PEDOT/PSS or a printable metal). Examples of suitable materials for the precursor semiconductor material are precursor pentacene (A. Afzali et al. J. Am. Chem. Soc., vol., 124, 30, 2002), precursor porphyrin or precursor poly-phenylene-vinylene (PPV) or polythienylenevinylene (PTV). This process is capable of patterning the semiconductor active layer island, and the surface energy barrier for self-aligned deposition of the source-drain electrodes in a single step.

During the deposition of the source-drain contacts, care should be taken that the conductive ink for the source-drain contacts dries in such a way that a good physical contact is established between the metal source-drain contacts and the semiconducting active layer island in order to achieve a low contact resistance. The electrical contact can also be improved by depositing a second semiconducting layer on top of the final structure which increases the contact area between the semiconducting layer(s) and the source-drain contacts.

A variation of the above described embodiment consists of a bottom gate configuration comprising a gate electrode in the shape of a series of interconnected locally parallel lines with spaces in between that can be used to define a self-aligned interdigitated source and drain array. This has the effect of increasing the channel width for a given area of the device.

The above method can be applied as well to patterned deposition of semiconducting or conducting material from the gas phase. The difference in surface properties of the thermally switchable material between light/heat exposed and unexposed regions can be adjusted such that the sticking coefficients for the evaporated material is very low in one of the two regions leading to no or minimal deposition of material in this region (H. Y. Choi, et al., Advanced Materials, 16, 732 (2004)).

Another embodiment of the present invention is a process for forming a self-aligned electrode, which is based on defining a pattern of a first conductive, semiconductive, or surface energy modification layer on the substrate, depositing a series of other materials on top, and patterning a second conductive, semiconductive, or surface energy modification layer by scanning a focussed light beam across the substrate, impinging on the substrate from the backside with a wavelength at which the first conductive, semiconductive or surface energy modification layer is opaque, such that a local change in the physical or chemical properties of the second conductive, semiconductive or surface energy modification layer is induced in all locations where the light beam was scanned, except in those regions where the path of the light was blocked by the first conductive, semiconductive or surface energy modification pattern.

In FIG. 10 a cross section of a self-aligned bottom-gate transistor is shown fabricated by this embodiment of the invention. On a substrate 1 a gate electrode 7 which is opaque to the laser wavelength of the light source employed. A first gate dielectric layer 9 is deposited as a thin film. Then a light sensitive layer 21 is deposited. The light sensitive layer changes its physico-chemical properties upon light irradiation, such that it can be developed (D) after the light beam has been scanned across the surface to write the desired pattern. In the unilluminated regions 24, 23 the layer remains on the substrate, and defines a self-aligned surface energy pattern for the deposition of the conductive source-drain electrodes 3, followed by the deposition of the semiconducting active layer 8. One of the preferred features of this embodiment is that the surface energy pattern consists of regions 24 that are defined by the scanning pattern of the focussed laser beam, (which never scans across region 24), while other regions 23 are defined by shadowing by the gate electrode. This allows self-aligned definition of the critical features, i.e. the channel length of the device, while enabling the coarse features of the source-drain array to be independent of the shape of the gate electrode and interconnect pattern. Definition of regions 24 and 23 might also be achieved in two separate process steps, with region 24 defined by exposing the substrate from the top surface to avoid any shadow effects for the definition of coarse features 24.

Alternatively, the photo-patterned structures 24, 23 may also be washed away after deposition of the source and drain electrodes 3. This may be achieved by developing with solvents, or by using the solvent to etch away the dielectric layer by carrying out a blanket exposure of the structure from above. This method allows a greater choice of material for the dielectric layer 9, as it is not required to perform as a dielectric. Examples of materials that can be used for the dielectric layer are most positive tone photoresists.

In one variation, as shown in FIG. 11, a semiconductor layer 8 is deposited directly on top of the first dielectric layer 9. A photo-patternable layer 21 is deposited over the semiconductor layer. The photo-patternable layer is then patterned followed by the deposition of source-drain electrodes. The deposition of source-drain electrodes might be preceded by a surface modification step, such as a plasma treatment step or exposure to a surface modifying agent which renders the surface of the semiconducting layer in the exposed regions wetting to the ink of the source-drain electrode. The presence of the semiconducting layer puts an upper limit to the frequency used for the laser, i.e. the onset of absorption of the semiconductor material itself. This has the effect of limiting the light beam spectral range to IR and the lower parts of the visible spectrum.

In another variation, as shown in FIG. 12, a semiconducting layer 8 is deposited over the dielectric layer 9. The laser beam is used to ablate away the semiconductor, leaving a strip of semiconductor 25 that is self aligned over the gate electrode. Subsequently, the source and drain contacts are ink jet printed to form the TFT, which is coplanar in this case. In order for this method to work, the frequency of the laser has to be in the spectral range above the onset of absorption of the semiconductor, but below that of the dielectric and the substrate, i.e. somewhere in the visible, depending on which semiconductor is used. As in all the examples presented in this invention, the gate contact 7 is also opaque to the light beam so that it may act as a shadow mask.

In FIG. 13 a cross-section of a self-aligned bottom gate transistor device is shown, both before (A) and after (B) the photo-patternable layer has been patterned via the combination of two laser heads: one operating from below the substrate 19 and the second operating from above the substrate 20. A variation of this embodiment requiring only one laser head involves initially scanning the laser on one side of the substrate, followed by, if necessary, scanning the substrate from the other side. FIG. 13(C) shows the top-view of a transistor device structure: the gate electrode and the upper patterned layers have been included for clarity. The ridge edges 23, created after the patterning of the upper layer 21, are entirely defined by the shadow of the bottom electrode 7. This area may be defined by shinning the laser head from the bottom of the substrate. The outer edges of the wells 24 are defined by the x-y movement of the laser head. These wells 26 are defined to a size suitable to accommodate the droplets of conductive ink (~tens of micrometers) and are thus about an order of magnitude larger than the channel dimensions. Thus, the x-y movement of the laser head is sufficient to achieve the required coarser resolution of the ridge edges on the upper patterned layer. The wells can be entirely defined by the bottom laser head or by a combination of irradiation from the top and bottom of the substrate, where the latter defines the more delicate regions close to gate electrode and the remaining regions are defined by the movement of the top laser head. As shown in the top view in FIG. 13C, it is often convenient to define rectangular wells to accommodate the conductive ink. It is only the central strip or channel area which needs to reproduce or be self-aligned to the bottom electrode. The remaining edges bear no affinity to any pattern present on the bottom substrate layer. Some of these ridge edges may lie over regions containing electrodes, as seen in FIG. 13B. The top laser head is used to photo-impress the required pattern. For complex circuits that involve the connection of a multitude of different devices and interconnections, the combined laser head approach is used. If required, additional features can be deposited on the substrate layer that have the function of being employed as shadow masks in subsequent patterning steps.

Another embodiment of the present invention is a technique that enables laser annealing of a layer of a printed conductive or semiconductive material deposited on top of a substrate containing other electroactive layers and conversion of the printed conductive or semiconductive material into a high conductive state by laser annealing without significant degradation of such previously deposited electroactive layers. The printed conductive or semiconductive material is preferably an inorganic metallic nanoparticle or a chemical precursor molecule to an inorganic metal. The method involves printing a first line of conductive or semiconductive material on a substrate followed by local annealing with a focussed laser beam with a lateral beam width that is less than the linewidth of the printed line, resulting in local conversion of a portion of the printed line into a high conductivity form. Alternatively, a process of blanket annealing may be carried out, where the lateral beam width may be more than the linewidth of the printed line.

However, in this case, the other layers of the device must be less absorbing than the linewidth. During the step of local annealing of the first line of conductive or semiconductive material a second conductive, semiconductive, or surface energy modification layer is patterned by the focussed laser beam, in such a way that the pattern of the second conductive, semiconductive or surface energy modification layer is self-aligned with the high conductivity portion of the first line of conductive or semiconductive material.

Another embodiment is a method of forming either a high conductivity electrode or an interconnect from a solution-deposited printable metal ink that is deposited on top of a substrate. The substrate may already contain one or more electroactive layers of the device. The printable metal ink layer may be based on inorganic nanoparticles such as silver or gold nanoparticles suspended in a solvent. The surface of the nanoparticle layer may be functionalized with an organic molecule to improve the solubility of the nanoparticles and prevent them from aggregating in suspension. Alternatively, the printable metal ink may be based on a chemical precursor molecule that can be converted into a highly conducting metallic form by thermal annealing. Other forms of printable metals may also be used. In most cases the deposited material will require a post-deposition processing step, such as the above mentioned thermal annealing step. Due to the presence of the organic solubilizing groups, and the poor connectivity of the nanoparticle deposit, the as-deposited film tends to have low electrical conductivity. Annealing at a typical temperature range of 150-350° C. is required in order to reach a conductivity approaching that of the constituent bulk metal. Two key problems known in the prior art, arise when attempting to use such printable metal inks for the fabrication of active transistor devices:

Many electroactive materials, such as conjugated polymer semiconductors or polymer dielectrics exhibit performance degradation when annealed to temperatures in excess of 150° C., resulting in a reduction in performance. This prevents the use of printable metal inks in applications where the substrate already contains electroactive layers, such as for example in the case of the gate electrode deposition of a top-gate polymer TFT, or in the case of source-drain electrode deposition of a bottom-gate TFT. Here we disclose a laser annealing technique that allows conversion of the material into a highly conducting form without leading to degradation of underlying electroactive layers.

Printable metal inks can be deposited from solution by continuous film coating techniques such as spin coating or blade coating, or by direct-printing techniques such as inkjet, gravure, offset or screen printing. However, in most of these cases the high resolution patterning of the deposited material to form a line with a width of less than 40 μm is challenging. For example, we have found that the inkjet printing of a water-based colloidal silver ink with a droplet volume of 14 pl (30 Micron diameter) onto a wetting substrate coated with a wetting layer of polyvinylphenol, results in line widths of 45 μm and 75 μm, respectively. Narrower line widths leading to smaller TFT size and reduction of parasitic capacitance can be achieved by surface-energy assisted inkjet printing techniques described above, requiring however both a surface energy pre-patterning step as well as the post-deposition annealing step discussed above. The present invention discloses a laser imaging technique that is capable of defining both a narrow line width, and enhancing the conductivity in a single process step.

In the production of organic transistor devices, the substrate on which the metallic ink is deposited may already contain a functional layer of the device, such as a semiconducting or a dielectric layer, and significant degradation of the performance of such underlying layers can occur during laser annealing. Such degradation often manifests itself in a reduction of the field effect mobility of the polymer semiconductor. This is believed to be caused by the heating of the whole device structure during the laser annealing step or by exposing the electroactive material to intense laser irradiation causing photodegradation, particularly if the laser annealing step is performed in an atmosphere of residual oxygen or moisture.

In this embodiment, the device architecture is constructed in such a way that it comprises a layer of a material of low thermal conductivity, separating the layer of printable metal to be laser annealed from any of the underlying heat-sensitive layers. The layer of material of low thermal conductivity is preferably a polymer layer with a low thermal conductivity. For example, for the laser annealing of the gate electrode in a top-gate device configuration the gate dielectric layer may be chosen that has a low thermal conductivity. A suitable polymer gate dielectric is poly-methylmethacrylate exhibiting a thermal conductivity of only $1\text{-}2\cdot 10^{-3}$ W/cm·K which is more than three orders of magnitude lower than that of silver, and also 2-3 orders of magnitude lower than that of other common dielectrics such as $SiO_2$ or $Al_2O_3$. Therefore, heat generated during the laser annealing step is conducted efficiently within the gate electrode pattern, but the underlying layers are not heated to significant temperatures, therefore avoiding material degradation.

Alternatively or additionally, the laser is chosen to be a high intensity, shuttered continuous wave laser. The laser will preferably have, but is not limited to, a pulse duration on the order of 1 μs and a pulse power of $10^4$ to $10^6$ W/cm². Alternatively, a pulsed laser may be used with a peak power of 1.5 MW/cm² and an average power of 780 W/cm². During each pulse of the laser beam, the heat conducted through the layer of material of low thermal conductivity is sufficiently low to avoid any degradation of the underlying electroactive layers, which may result from a significant increase in temperature.

In addition, the laser wavelength is chosen so as to be strongly absorbed by the printable metal ink deposit, but not in any of the underlying heat-sensitive layers. Preferably, the laser beam is of an infrared wavelength of, but not limited to 1064 nm or 830 nm. Most organic semiconductors and dielectrics of a high band gap are transparent to infrared light, minimizing the effects of light-induced degradation. In contrast, the metal deposit will naturally absorb the laser radiation due to the surface plasmon resonance frequency of the metal nanoparticles. Excimer lasers may also be used, preferably where the laser wavelength is chosen so as to not overlap with any of the optical band gap transitions of the organic semiconductors.

Another embodiment is a method of defining narrow linewidth, highly conducting lines of printable metals by solution deposition and subsequent exposure to a focussed laser beam. The metal can be solution-deposited either as a thin, continuous film 27 (FIG. 14) or as line 29 with a relatively broad line width of several 10 μm (FIG. 15A). In the latter case deposition might be using printing techniques such as, but not limited to, inkjet, screen, flexographic or offset printing. The metal deposit is then annealed locally by exposure to a tightly focussed laser beam (FIG. 14/15(A)). The laser beam is preferably more tightly focussed than the line width of the printed lines. During the laser annealing stage, the exposed portion 29 of the deposit is converted into a highly conducting, insoluble form. In the case of precursor based inks, the converted metal is generally insoluble in the solvent from which the precursor material was deposited. In cases where nanoparticle inks are used, the local heating causes the nanoparticles to coalesce, forming a highly conducting region, which also is no longer soluble. In the unexposed edge region 30 of the lines the material remains in a low-conductivity, soluble form. Preferably, the laser beam has a focus width of less than 20 μm. The layer of metal deposit can then be patterned by developing the laser exposed printable metal in a suitable solvent, such as the solvent from which the printable metal had originally been deposited. In the case of a continuous film deposit, as used in this embodiment, (FIG. 14) the unexposed portions of the film are removed after the laser exposure.

In the case of a line deposit (FIG. 15A), the development step removes the edge regions 30, and leaves behind only the centre of the lines that have been converted by exposure to the narrowly focussed laser beam. In the latter case the development step may also be omitted. The conductivity of as-deposited printable metals is several orders of magnitude lower than that of the thermally converted form, i.e., for some applications the unexposed edge regions can be regarded as insulating regions, that do not need to be removed.

One variation of this embodiment is shown in FIG. 15B. In this case exposure of the printed line 28 is through the back of the substrate that already contains at least one patterned layer 3. The patterned layer 3 is opaque to the laser radiation, for example it can be a previously deposited pattern of printable metal for source and drain electrodes. In this case the printed line 28 is only exposed and converted in the substrate region which is not covered by the patterned layer 3, even if the laser beam is not very tightly focussed. In the case of the patterned layer 3 being source and drain electrodes of the TFT separated by the short channel region, the gate line is only laser annealed in the channel region 29 itself, where it becomes highly conducting, while in the overlap regions with the source and drain electrodes, the gate line is not annealed and remains in a low-conductivity, soluble form. The unexposed edge regions of the line can be removed in a subsequent development step. They can also be left as they are, since due to their low conductivity, they will not result in significant parasitic overlap capacitance between gate electrode 29 and source/drain electrodes 3. This process provides a method for forming a self aligned gate electrode in a top-gate TFT with minimum parasitic overlap capacitance. It can analogously also be applied to form self-aligned source-drain electrodes for a bottom gate TFT. In a self-aligned configuration the position of the gate electrode is very accurately defined with respect to the edges of the source-drain electrodes without the need for very precise positioning of the exposure beam.

In the process illustrated in FIG. 16, the structure comprises a bottom-gate TFT with an upper conductive layer 31 that is photo-patternable. A suitable conductive gate electrode layer is a nanoparticle or precursor based printable metal, such as silver or gold that becomes insoluble in the solvent from which it was originally deposited after laser annealing and curing. The source and drain electrodes are defined by laser annealing of the conductive layer through the back of the substrate using the gate electrode to shadow and define the channel of the TFT. The other dimensions of the source and drain electrodes are defined by the exposure pattern of the focussed laser beam. After the laser exposure the layer is developed in a solvent that removes the unexposed regions of the conductive gate electrode layer. Subsequently, the semiconducting layer of the TFT is deposited.

In all of the above embodiments the laser power should be adjusted carefully. FIG. 17 shows optical micrographs, and TFT transfer characteristics of F8T2 TFTs incorporating low thermal conductivity PMMA gate dielectric and inkjet printed gate electrodes formed from nanoparticle silver dispersion. The aforementioned gate electrodes are laser-annealed at different power levels ranging from 2 W to 10 W using an 830 nm infrared laser. For 5 W laser power the device performance is good, however, for higher laser power clear evidence for degradation is observed. In addition, a low laser power produces poor gate conductivity. This figure also shows variation of silver conductivity with laser power.

A variation of the present embodiment incorporates an adhesive layer between the dielectric layer of low thermal conductivity and the metallic deposit. This layer bonds the metallic layer to the dielectric layer and is thermally activated by the laser heating. A suitable material would preferably be PVP. Such a material is capable of bonding the said deposit to the dielectric layer and decomposes when heated.

In a further embodiment of the present invention, a metal nanoparticle line 32 is patterned on a substrate 1. A dielectric layer 9 is uniformly coated over the substrate on top of the patterned nanoparticle layer. The dielectric layer is chosen to be non-absorbing at the laser frequency used. A donor sheet 33 is prepared consisting of a carrier substrate 35 coated with an absorbing hydrophobic layer 34, such as, but not limited to, polyimide. There may also be a dynamic release layer between the carrier substrate and the hydrophobic layer.

The donor sheet 33 is placed in proximity to the substrate 1, with a separation of ~10 um, and is positioned with the hydrophobic layer 34 facing the dielectric layer 9, as shown in FIG. 18a. A laser beam 36 is then focussed on the dynamic release layer (DRL) of the donor sheet, causing the transfer of the hydrophobic layer 37 to the surface of the dielectric layer, as shown in FIG. 18b. The donor sheet is chosen such that it is partially transparent to the light of the laser beam, i.e. its optical density is preferably less than 0.5-1. Simultaneously, the laser is strongly absorbed by the metal nanoparticle region 32, resulting in local annealing of this region. The substrate now contains a hydrophobic barrier directly above, and self-aligned to, a narrow highly conducting gate electrode 40 surrounded by a much less conductive nanoparticle layer. The dielectric layer is transparent with respect to the laser beam. Conducting ink, such as but not limited to, PEDOT/PSS then may be printed on the surface of the dielectric layer, forming the source and drain contacts 3. The resultant channel is self-aligned to the gate, as shown in FIG. 18c.

In another embodiment of the present invention, a dielectric layer 9 is uniformly coated over the substrate and patterned metal nanoparticle layer 31. The dielectric layer is chosen to be non-absorbing at the laser frequency used. A further conducting material may be deposited on the dielectric layer that is capable of being ablated. A dynamic release layer (DRL) 42 may be added to the substrate between the dielectric and the ablatable upper conductive layer 41. This device structure is shown in FIG. 19a A laser beam is focussed on the substrate as shown in FIG. 19b, and through intrinsic absorption the upper conducting region is locally ablated. Simultaneously, the metal nanoparticle region is thermally annealed by the laser beam. Again, the upper conductive layer is chosen such that it is partially transparent to the light of the laser beam, i.e. its optical density is preferably less than 0.5-1. As a result, a TFT channel is formed in the upper conducting region and is self-aligned to a thermally annealed metal nanoparticle gate in the lower layer of the device. This is shown in FIG. 19c. An advantage of this method is that the footprint of the TFT is reduced to the size of a single printed droplet. Additionally, 5 µm channels and gates are achievable due to the 5 µm laser spot.

A further embodiment is illustrated in FIG. 20. A substrate 1 is patterned with a highly conductive material, preferably silver, gold or ITO. In the present embodiment, these metallic lines may act as gate contacts 45. A dielectric layer 46, such as BCB (benzocyclobutene), is then deposited over the gate electrode. A laser beam may be used to cure the dielectric layer in order pattern the BCB, therefore changing the surface energy properties and increasing the dielectric properties. The laser wavelength is chosen to be strongly absorbed by the gate contact 45. Preferably, the light is of infrared wavelength. The gate material is heated as a result of the light absorption, and the absorbed heat cures the dielectric layer above and in the immediate vicinity of the gate electrode. The lateral dimension "s" of the region in which the gate dielectric is cured away from the edge of the gate electrode is determined by the thermal conductivity of the gate dielectric material. A preferable curing process may be, but is not limited to, UV irradiation or thermal annealing. A suitable dielectric material may be chosen such that it is dewetting to the deposited conductive ink 3 and forms the source and drain electrodes. The said conductive ink is preferably PEDOT/PSS. A semiconductor layer is then deposited over the channel, between the source and drain contacts. A suitable semiconducting material may be, but is not limited to poly(dioctylfluorene-co-bithiophene) (F8T2). This embodiment has the advantage of eliminating any further steps that may be associated with traditional gate deposition processes.

The processes and devices described herein are not limited to devices fabricated with solution-processed polymers. Some of the conducting electrodes of the TFT and/or the interconnects in a circuit or display device (see below) may be formed from inorganic conductors, that are able to, for example, be deposited by the printing of a colloidal suspension or by electroplating onto a pre-pattered substrate. In devices where not all of the layers deposited from solution, one or more PEDOT/PSS portions of the device may be replaced with an insoluble conductive material such as a vacuum-deposited conductor.

Possible materials that may be used for the semiconducting layer, includes any solution processible conjugated polymeric or oligomeric material that exhibits adequate field-effect mobilities exceeding $10^{-3}$ cm$^2$/Vs and preferably exceeding $10^{-2}$ cm$^2$/Vs. Materials that may be suitable have been previously reviewed, for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic nanowires.

The electrodes may be coarse-patterned by techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques. However, inkjet printing is considered to be particularly suitable for large area patterning with good registration, in particular for flexible plastic substrates. In the case of surface-energy direct deposition, materials may also be deposited by continuous film coating techniques such as spin, blade or dip coating, which are then able to be self-patterned by the surface energy pattern.

Although preferably all layers and components of the device and circuit are deposited and patterned by solution processing and printing techniques, one or more components may also be deposited by vacuum deposition techniques and/or patterned by photolithographic processes.

Devices such as TFTs fabricated as described above may be part of more complex circuits or devices, in which one or more such devices can be integrated with each other and/or with other devices. Examples of applications include logic circuits and active matrix circuitry for a display or a memory device, or a user-defined gate array circuit.

Patterning processes, as described above, may also be used to pattern other circuitry components, such as, but not limited to, interconnects, resistors and capacitors.

The present invention is not limited to the foregoing examples. Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of producing a metal element of an electronic device on a substrate, including:
    forming a mixture of a material comprising metal atoms with a liquid;
    depositing the material from the liquid mixture onto a substrate;
    forming a further layer over the deposited material; and
    then irradiating at least part of the deposited material with light to increase the electrical conductivity of the deposited material; wherein said irradiating is done through a transfer layer of a donor sheet and said further layer, and said irradiating through said transfer layer causes transfer of a portion of said transfer layer from said donor sheet to the surface of said further layer.

* * * * *